United States Patent
Ocker

(10) Patent No.: US 11,508,426 B1
(45) Date of Patent: Nov. 22, 2022

(54) MEMORY DEVICE, MEMORY CELL ARRANGEMENT, AND METHODS THEREOF

(71) Applicant: Ferroelectric Memory GmbH, Dresden (DE)

(72) Inventor: Johannes Ocker, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 0 days.

(21) Appl. No.: 17/510,956

(22) Filed: Oct. 26, 2021

(51) Int. Cl.
  *G11C 11/22* (2006.01)
  *G11C 16/34* (2006.01)

(52) U.S. Cl.
  CPC ...... *G11C 11/2273* (2013.01); *G11C 11/2275* (2013.01); *G11C 11/2277* (2013.01); *G11C 11/2297* (2013.01); *G11C 16/3404* (2013.01)

(58) Field of Classification Search
  CPC ............ G11C 11/2273; G11C 11/2275; G11C 11/2277; G11C 11/2297; G11C 16/3404
  See application file for complete search history.

(56) References Cited

U.S. PATENT DOCUMENTS

| 7,133,306 B2 * | 11/2006 | Suzuki | G11C 11/22 365/210.15 |
| 2005/0180222 A1 * | 8/2005 | Suzuki | G11C 11/22 365/189.05 |

\* cited by examiner

*Primary Examiner* — Jay W. Radke
(74) *Attorney, Agent, or Firm* — Hickman Becker Bingham Ledesma LLP; Malgorzata A. Kulczycka

(57) ABSTRACT

Various aspects relate to a memory cell arrangement including: a field-effect transistor based capacitive memory cell including a memory element, wherein a memory state of the memory element defines a first memory state of the field-effect transistor based capacitive memory cell and wherein a second memory state of the memory element defines a second memory state of the field-effect transistor based capacitive memory cell; and a memory controller configured to, in the case that a charging state of the field-effect transistor based capacitive memory cell screens an actual threshold voltage state of the field-effect transistor based capacitive memory cell, cause a destructive read operation to determine whether the field-effect transistor based capacitive memory cell was, prior to the destructive read operation, residing in the first memory state or in the second memory state.

20 Claims, 9 Drawing Sheets

600

610

Instructing a write operation to switch the field-effect transistor based capacitive memory cell into a pre-defined memory state defined by the write operation in the case that an actual memory state in which the field-effect transistor based capacitive memory cell is residing in is distinct from the pre-defined memory state and/or to keep the field-effect transistor based capacitive memory cell in the pre-defined memory state in the case that the actual memory state in which the field-effect transistor based capacitive memory cell is residing in is the pre-defined memory state

620

Determining whether the field-effect transistor based capacitive memory cell is in an electrical conductance state that indicates a switching and/or a non-switching of the field-effect transistor based capacitive memory cell during the write operation to determine whether or not the field-effect transistor based capacitive memory cell was, prior to the instruction of the write operation, residing in the pre-defined memory state

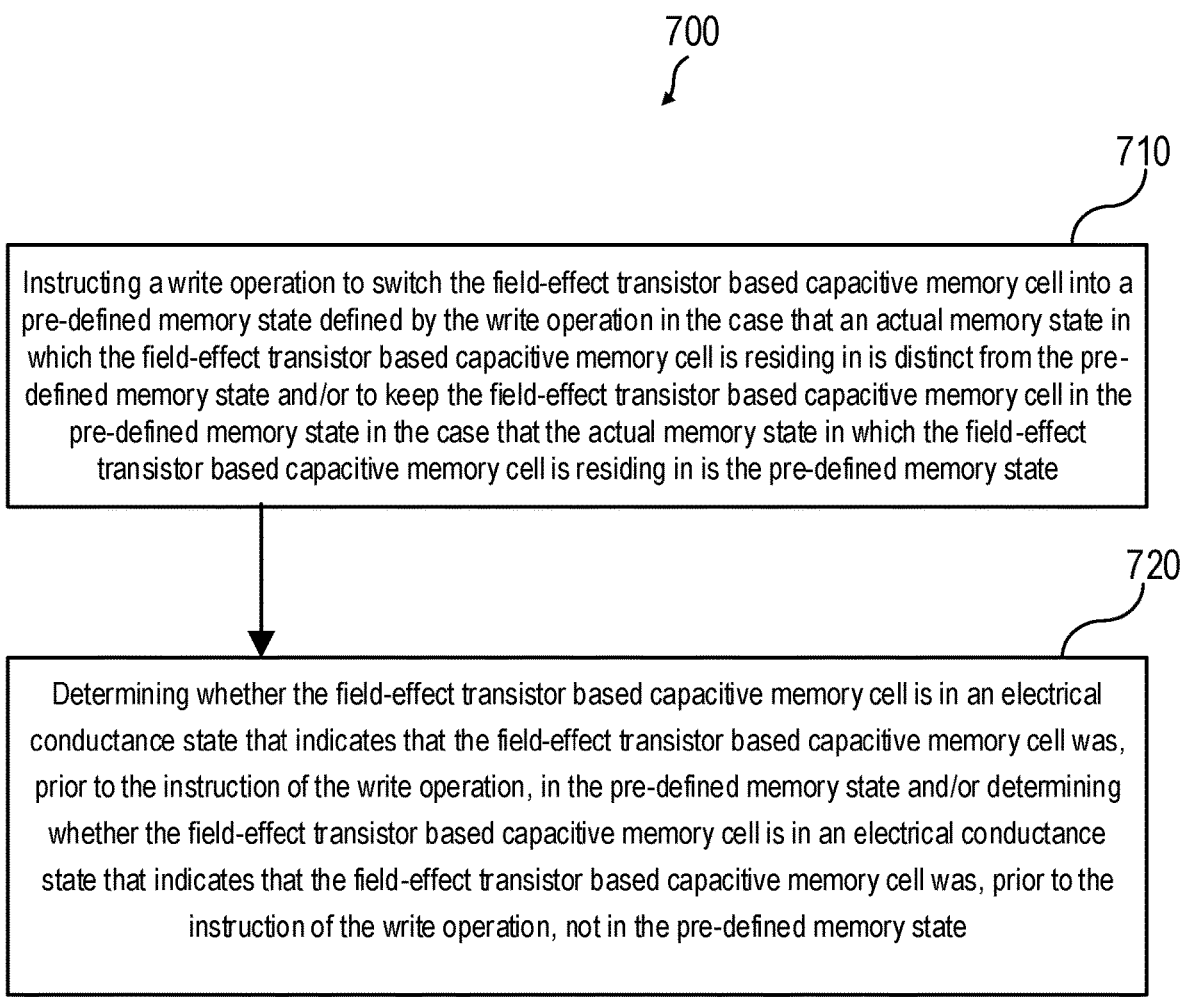

MEMORY DEVICE, MEMORY CELL ARRANGEMENT, AND METHODS THEREOF

TECHNICAL FIELD

Various aspects relate to an electronic device or at least a part of an electronic device, e.g., to a memory device, a memory cell controller, a memory cell arrangement, and methods thereof, e.g., a method for reading a memory cell.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may be selectively in one of at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing in. At present, various types of memory cells may be used to store data. By way of example, a type of memory cell may include a thin film of a spontaneously polarizable material, e.g., a ferroelectric material or a configuration of an anti-ferroelectric material, whose polarization state may be changed in a controlled fashion to store data in the memory cell, e.g. in a non-volatile manner.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 7 shows a schematic flow diagram of a method of reading a memory cell, according to various aspects.

DESCRIPTION

Figure 1A:
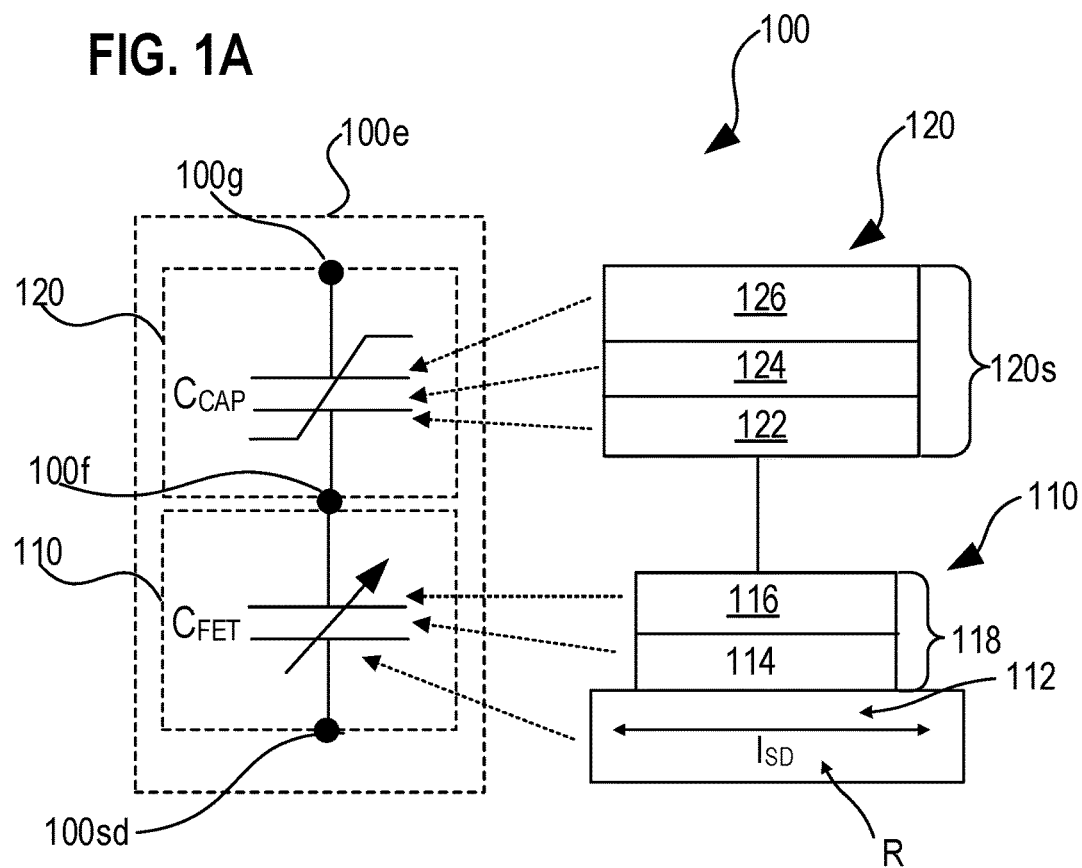
FIG. 1A and FIG. 1B show various aspects of a memory cell in a schematic view.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

Various aspects may be related to a read operation to read a field-effect transistor based capacitive memory cell more efficiently, e.g., to allow for a read out of the field-effect transistor based capacitive memory cell in the case that a floating node of the field-effect transistor based capacitive memory cell is charged during the data retention time, as explained in more detail below.

According to various aspects, a memory cell as described herein may include a field-effect transistor structure and a capacitive memory structure. The capacitive memory structure may be coupled to the field-effect transistor structure, e.g., to a floating gate of the field-effect transistor structure, and/or integrated in the field-effect transistor structure, e.g., integrated in a gate (e.g., in a gate stack) of the field-effect transistor structure. A memory cell that includes a field-effect transistor structure and a capacitive memory structure coupled to one another may be referred to as field-effect transistor based capacitive memory cell. In some aspects, the field-effect transistor based capacitive memory cell may include three terminals (also referred to as nodes), e.g., a gate terminal (also referred to as gate node), a first source/drain terminal (e.g., a source terminal, also referred to as source node), and second source/drain terminal (e.g., a drain terminal, also referred to as drain node). The field-effect transistor based capacitive memory cell may include a floating gate between the gate dielectric of the field-effect transistor structure and a memory element of the capacitive memory structure. Since the floating gate is electrically isolated it may be possible that a charge can be transferred to the floating gate, e.g., due to one or more leakage currents assisted by an electrical field caused by the capacitive memory structure, such that the additional charge transferred to the floating gate may screen an actual memory state of the memory element and such that the field-effect transistor structure of the field-effect transistor based capacitive memory cell is not sensitive anymore for the actual memory state of the memory element.

According to various aspects, a capacitive memory structure may include a functional layer (e.g., a capacitive memory element) in a capacitive environment, e.g., disposed between two electrode layers or disposed between a channel of a field-effect transistor and an electrode layer (e.g., a gate electrode of the field-effect transistor). According to various aspects, a functional layer of a memory structure, e.g., of a capacitive memory structure such as a field-effect transistor based capacitive memory structure, may be spontaneously polarizable. According to various aspects, a capacitive memory element of a memory structure, e.g., of a capacitive memory structure such as a field-effect transistor based capacitive memory structure, may be spontaneously polarizable. A spontaneously polarizable layer may show a hysteresis in the (voltage dependent) polarization. The spontaneously polarizable layer may show anti-ferroelectric properties, e.g., the spontaneously polarizable layer may have no or no substantial remanent polarization remaining in the case that no voltage drops over the spontaneously polarizable layer. In other aspects, the spontaneously polarizable layer may show ferroelectric properties, e.g., the spontaneously polarizable layer may have a remanent polarization or a substantial remanent polarization remaining in the case that no voltage drops over the spontaneously polarizable layer.

According to various aspects, a functional layer (e.g., a spontaneously polarizable layer) of a memory structure, e.g., of a capacitive memory structure, may include or may be made of a spontaneously polarizable (e.g., an anti-ferroelectric and/or ferroelectric) material. According to various aspects, a capacitive memory element of a memory structure, e.g., of a capacitive memory structure, may include or may be made of a spontaneously polarizable (e.g., an anti-ferroelectric and/or ferroelectric) material. An anti-ferroelectric material may show a hysteresis in the (voltage dependent) polarization, however, with no or no substantial remanent polarization remaining in the case that no voltage drops over the anti-ferroelectric material. A ferroelectric material may show a hysteresis in the (voltage dependent) polarization, however, with a (e.g., substantial) remanent polarization remaining in the case that no voltage drops over the ferroelectric material.

According to various aspects, in various types of applications, e.g., in memory technology, a remanent polarization as low as 0 µC/cm² to 3 µC/cm² may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than 3 µC/cm² may be regarded as substantial remanent polarization. Such a substantial remanent polarization may allow for storing information as a function of a polarization state of a spontaneously polarizable layer or a spontaneously polarizable material.

A polarization capability of a material (dielectric, spontaneous, and remanent polarization) may be analyzed using capacity measurements (e.g., a spectroscopy), e.g., via a static (C-V) and/or time-resolved measurement or by polarization-voltage (P-V) or positive-up-negative-down (PUND) measurements. Another method for determining a polarization capability of a material may include transmission electron microscopy, e.g., an electric-field dependent transmission electron microscopy.

According to various aspects, a memory device may include a memory cell and a memory controller to operate (e.g., read and write) the memory cell. According to various aspects, a memory cell arrangement may include a memory cell and a memory controller to operate (e.g., read and write) the memory cell. It is noted that some aspects are described herein with reference to a memory cell of a memory device and/or with reference to a memory cell of memory cell arrangement; it is understood that a memory device and/or a memory cell arrangement may include a plurality of such described memory cells according to various aspects that can be operated in the same way by the memory controller, e.g., at the same time or in a time sequence. The memory cell arrangement may further include respective sets of control lines and voltage supply levels configured to operate the one or more memory cells of the memory device and/or the memory cell arrangement.

Figure 1B:
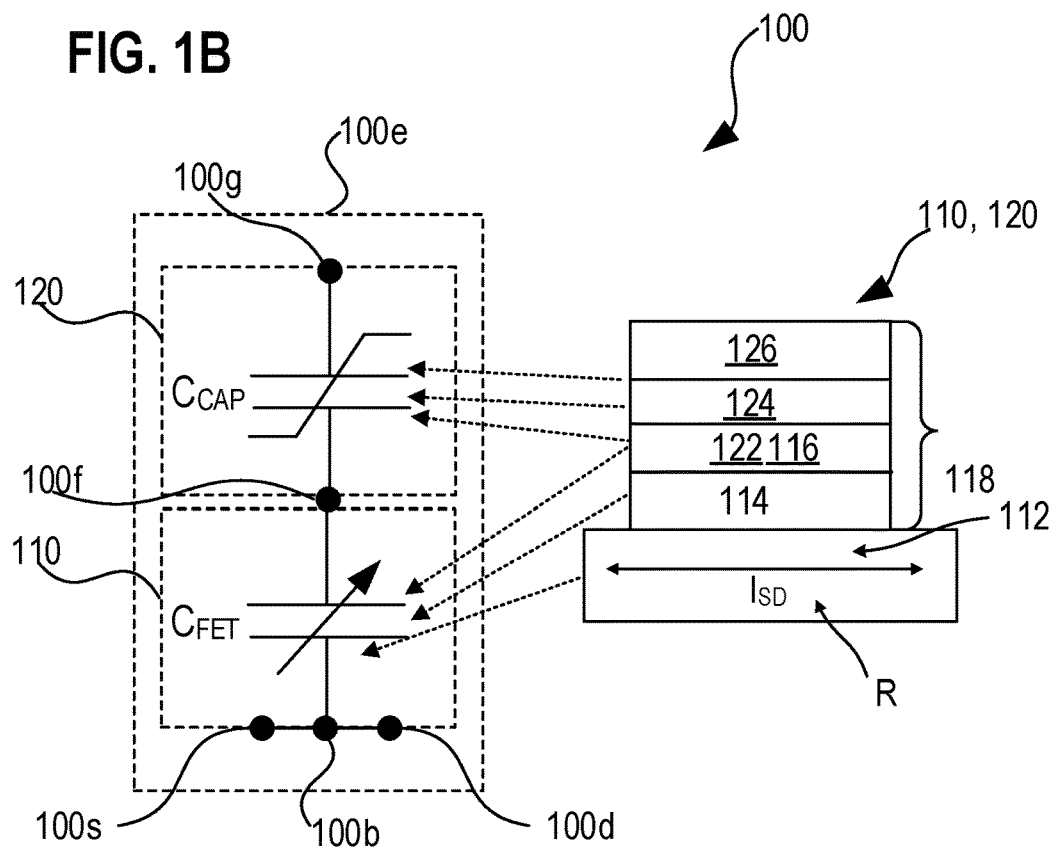

FIG. 1A and FIG. 1B show respectively various aspects of a memory cell 100. The memory cell 100 may be a field-effect transistor based capacitive memory cell, according to various aspects. The memory cell 100 may include a field-effect transistor structure 110 and a capacitive memory structure 120. In some aspects, the capacitive memory structure 120 may be coupled to the field-effect transistor structure 110, see FIG. 1A, or the capacitive memory structure 120 may be, in other aspects, integrated into the field-effect transistor structure 110, see FIG. 1B. Basically, the memory cell 100 may include a field-effect transistor structure and a memory element (e.g., a spontaneously polarizable layer).

As illustrated in FIG. 1A, the capacitive memory structure 120 may include at least two electrodes 122, 126 (e.g., two electrode layers) and a memory element 124 coupled to the at least two electrodes 122, 126. The memory element 124 may include or may be a functional layer disposed between two electrodes 122, 126. The memory element 124 may include or may consist of any type of suitable memory material, as for example, a spontaneously polarizable material (e.g., a remanent polarizable material, e.g., a ferroelectric or anti-ferroelectric material). According to various aspects, the memory element 124 may be a capacitive memory element including, for example, an electrically non-conductive material such as a spontaneously polarizable material (e.g., a ferroelectric or anti-ferroelectric material). The capacitive memory structure 120 in a capacitive configuration may have a capacitance, $C_{CAP}$, associated therewith (see equivalent circuit 100e with respect to the capacitive properties). The two electrodes 122, 126 and the memory element 124 may form a memory layer stack 120s. In some aspects, the memory layer stack 120s may be a planar layer stack; however, other shapes may be suitable as well, e.g., curved shapes, angled shapes, coaxially aligned shapes, as examples. The capacitive memory structure 120 may be electrically connected to the field-effect transistor structure 110 (see FIG. 1A) or integrated in a gate structure 118 of the field-effect transistor structure 110 (see FIG. 1B).

In more detail, the field-effect transistor structure 110 may include a gate structure 118, wherein the gate structure 118 may include a gate isolation 114 and a gate electrode 116. It is noted that the gate electrode 116 of the field-effect transistor structure 110, that is, for example, in contact with the gate isolation 114, forms a floating gate node 100f of the memory cell 100 due to the capacitive memory structure 120 that is connected to or integrated in the gate structure 118 of the field-effect transistor structure 110. The gate structure 118 is illustrated exemplarily as a planar gate stack; however, it may be understood that the planar configuration shown in FIG. 1A is an example, and other field-effect transistor designs may include a gate structure 118 with a non-planar shape, for example a trench gate transistor design, a vertical field-effect transistor design, or other designs, such as a fin-FET design. The gate structure 118 may define a channel region 112, e.g., provided in a semiconductor portion (e.g., in a semiconductor layer, in a semiconductor die, etc.). The gate structure 118 may allow for a control of an electrical behavior (e.g., a resistance R) of the channel region 112, e.g., a current flow in the channel region 112 may be controlled (e.g., allowed, increased, prevented, decreased, etc.). In some aspects, the gate structure 118 may, for example, allow to control (e.g., allow or prevent) a source/drain current, $I_{SD}$, from a first source/drain region of the field-effect transistor structure 110 to a second source/drain region of the field-effect transistor structure 110 (the source/drains are provided in or adjacent to the channel but are not shown in FIG. 1A). The channel region 112 and the source/drain regions may be formed, e.g., via doping one or more semiconductor materials or by the use of intrinsically doped semiconductor materials, within a layer and/or over a layer. With respect to the operation of the field-effect transistor structure 110, a voltage may be provided (e.g., transferred to the floating gate node 100f of the memory cell 100) at the gate electrode 116 to control the current flow, $I_{SD}$, in the channel region 112, the current flow, $I_{SD}$, in the channel region 112 being caused by voltages supplied via the source/drain regions. The voltage provided (e.g., transferred to the floating gate node 100f of the memory cell 100) at the gate electrode 116 of the field-effect transistor structure 110 may be influenced by a gate voltage supplied to an (e.g., upper) electrode 126 of the capacitive memory structure 120 (e.g., the gate voltage supplied to the gate node 100g of the memory cell 100). The gate electrode 116 may include an electrically conductive material. According to various aspects, the gate isolation 114 may be configured to provide an electrical separation of the gate electrode 116 from the channel region 112 and further to influence the channel region 112 via an electric field generated by the gate electrode 116. The gate isolation 114 may include one or more electrically insulating layers, as an example.

In some aspects, the gate electrode 116 of the field-effect transistor structure 110 and the electrode 122 of the capacitive memory structure 120 that is connected to the field-effect transistor structure 110 may be spatially separated from one another and electrically connected via a conductive connection, e.g., one or more metal lines (see FIG. 1A). In other aspects, the gate electrode 116 of the field-effect transistor structure 110 and an (e.g., lower) electrode 126 of the capacitive memory structure 120 may be in direct physical contact with one another or implemented as a single (shared) electrode 116, 122, as illustrated in FIG. 1B.

The field-effect transistor structure 110 may have a capacitance, $C_{FET}$, associated therewith (see equivalent circuit 100e with respect to the capacitive properties). According to various aspects, the field-effect transistor structure 110 and the capacitive memory structure 120 form together a field-effect transistor based capacitive memory structure, e.g., in a capacitive voltage divider configuration, as exemplarily shown in FIGS. 1A and 1B. According to various aspects, a gate node 100g of the memory cell 100 may be provided by the upper electrode 126 of the capacitive memory structure 120. The memory cell 100 may include a floating node 100f provided by the lower electrode 122 of the capacitive memory structure 120 and/or the gate electrode 116 of the field-effect transistor structure 110. One or more source/drain/bulk nodes 100s, 100d, 100 of the memory cell 100 may be provided by the source/drain/bulk regions of the field-effect transistor structure 110.

In the following, various aspects of a memory cell 100 with respect to their electrical characteristics are described in more detail. The memory cell 100 described herein may be used in connection with any type of suitable memory controller, e.g., a memory controller that may generate different voltage levels for writing the memory cell (e.g., for writing one or more memory cells of a memory cell arrangement) and/or reading the memory cell (e.g., for reading one or more memory cells of a memory cell arrangement).

According to various aspects, the memory cell and the memory cell arrangement described herein may be configured complementary metal oxide semiconductor (CMOS) compatible, e.g., including standard CMOS-materials only and may require no special integration considerations (e.g., no special thermal budget which may avoid diffusion and/or contamination during manufacturing). CMOS compatible spontaneously polarizable materials may be used to implement the one or more memory cell based on, for example, $HfO_2$ and/or $ZrO_2$. Doped $HfO_2$ (e.g., $Si:HfO_2$ or $Al:HfO_2$) or other suitable spontaneously polarizable materials may allow for an integration of the spontaneously polarizable layer via known integration schemes.

Figure 2A:
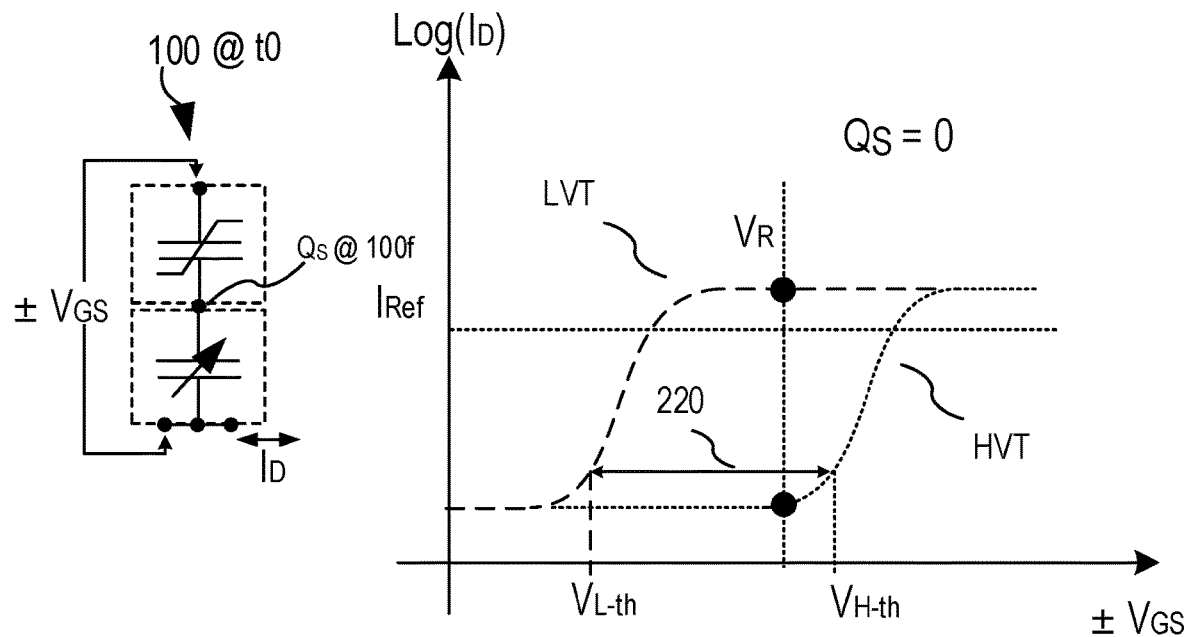
FIG. 2A to FIG. 2C show various aspects of electrical characteristics of a memory cell related to an operation of the memory cell in a schematic view.
Figure 2B:
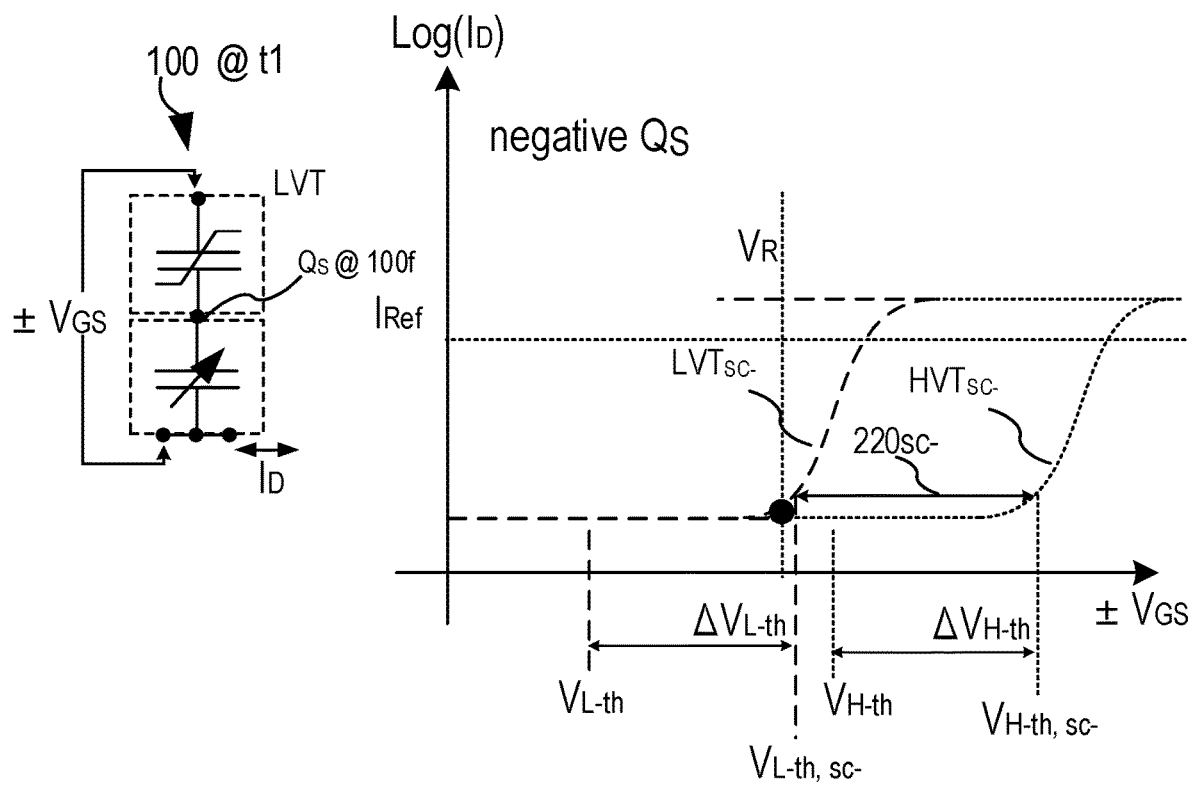
Figure 2C:
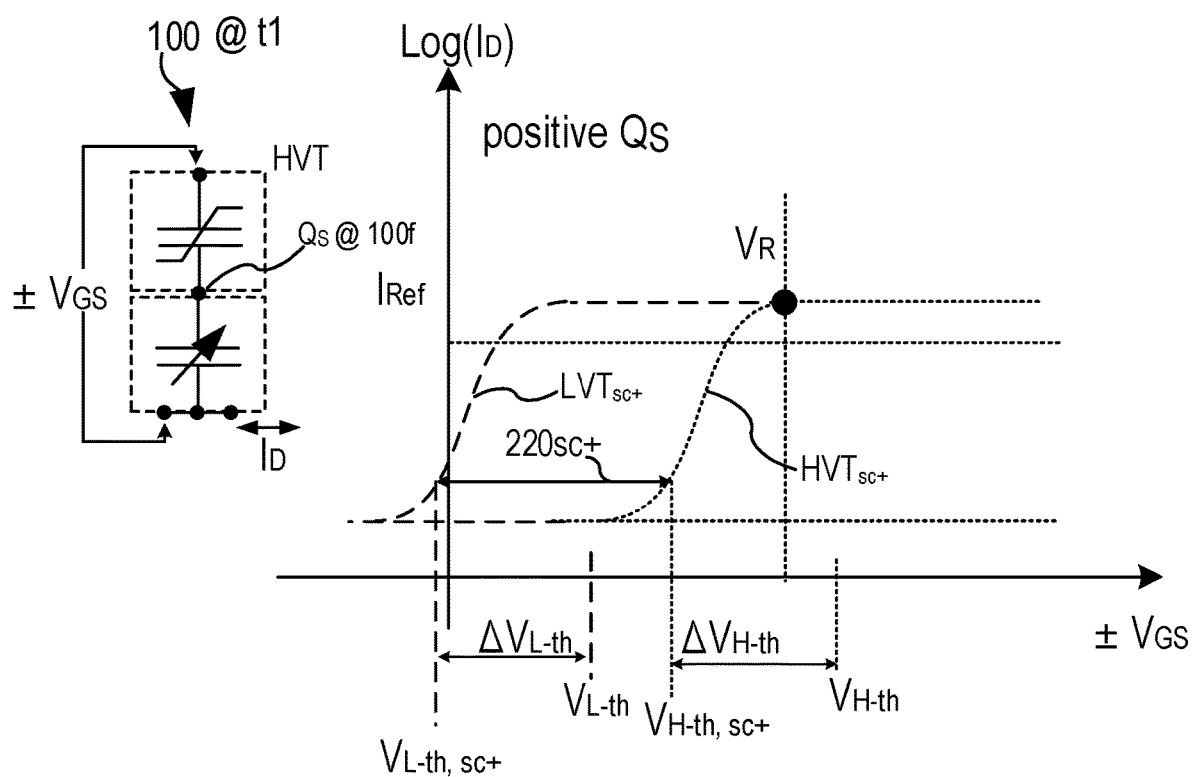

FIGS. 2A, 2B, and 2C illustrate electrical characteristics of a memory cell 100, e.g., a memory cell including a capacitive memory structure and a field-effect transistor structure, as a function of an additional screening charge Qs at the floating node of the memory cell. Respective current/voltage (I-V) diagrams illustrate the electrical characteristics, wherein the logarithm of a current flow between a drain node and a source node of the memory cell 100 (e.g., of the field-effect transistor structure 110 of the memory cell 100) is plotted versus an applied gate-source voltage drop, $V_{GS}$. The current flow between a drain node and a source node of the memory cell 100 may be also referred to as source/drain current, $I_{SD}$, or simply as drain current, $I_D$. The gate-source voltage drop associated with a gate structure (e.g. of a memory cell 100) may be defined by the respective voltages/potentials applied at the corresponding gate node (e.g., gate node 100g of the memory cell 100) and source node (e.g., source node 100s of the memory cell 100). The gate-source voltage drop may also be referred to as gate-source voltage, $V_{GS}$. In the case that the source voltage is zero, as used for example in conventional driving schemes for writing and/or reading of a field-effect transistor based memory cell, the gate-source voltage drop and the gate-source voltage, $V_{GS}$, may be referred to as gate voltage, $V_G$ (e.g., applied at the gate node 100g of the memory cell 100). It is noted that a gate-drain voltage drop or a gate-bulk voltage drop may show the same or similar behavior as described herein with reference to the gate-source voltage drop. However, a reading of a memory cell 100 may include usually applying a gate-source voltage drop, $V_{GS}$, and determining a property of a resulting drain current, $I_D$.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g. of a voltage pulse) are considered for the comparison. As an example, an n-type or p-type field-effect transistor (FET) based memory cell (e.g., memory cell 100 having a remanently polarizable memory element 124 or any other memory element that causes a shift of the floating node potential as a function of its memory state) may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g. the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g. the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g. the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g. the $V_{L\text{-}th}$ may be 1 V and the $V_{H\text{-}th}$ may be −1 V, or the $V_{L\text{-}th}$ may be 2 V and the $V_{H\text{-}th}$ may be 0 V, or the $V_{L\text{-}th}$ may be 3 V and the $V_{H\text{-}th}$ may be 1 V, only as numerical examples).

According to various aspects, a threshold voltage of a field-effect transistor or a field-effect transistor based memory cell may be defined as a constant-current threshold voltage (referred to as $V_{th(ci)}$). In this case, the constant-current threshold voltage, $V_{th(ci)}$, may be a determined gate-source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g. 0.1 μA. In some aspects, the constant-current threshold voltage, $V_{th(ci)}$, may be determined based on the following equation:

$$V_{th(ci)} = V_{GS} \text{ (at } I_D = I_{D0} * W/L)$$

A threshold voltage of a field-effect transistor or a field-effect transistor based memory cell (e.g., memory cell 100) may be defined by the properties of the field-effect transistor or of the field-effect transistor based memory cell (e.g., the materials, the doping, etc.), and it may thus be a (e.g. intrinsic) property of the field-effect transistor or of the field-effect transistor based memory cell.

According to various aspects, a memory cell may have at least two distinct memory states associated therewith, for example with two distinct electrical conductivities that can be determined to determine in which of the at least two distinct states the memory cell is residing in. A FET based memory cell (e.g., a remanent-polarizable memory cell) may include a first memory state, for example associated with a low threshold voltage state (referred to as LVT associated with the LVT memory state), and a second memory state, for example associated with a high threshold voltage state (referred to as HVT state associated with the HVT memory state). The high threshold voltage state may be, in some aspects, associated with a lower current flow during readout than the low threshold voltage state. The low threshold voltage state may be an electrically conducting state (e.g. associated with a logic memory state "1", also referred to as a memory state) and the high threshold voltage state may be an electrically non-conducting state or at least less conducting than the low threshold voltage state (e.g. associated with a logic memory state "0", also referred to as a memory state). However, the definition of the LVT state and the HVT state and/or the definition of a logic "0" and a logic "1" may be selected arbitrarily. Illustratively, the first memory state may be associated with a first threshold voltage of the FET based memory cell, and the second memory state may be associated with a second threshold voltage of the FET based memory cell.

According to various aspects, writing a memory cell or performing a write operation of a memory cell may include an operation or a process that modifies the memory state the memory cell is residing in from a (e.g. first) memory state to another (e.g. second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing n-type FET based memory cell may modify the state the memory cell is residing in from the LVT state to the HVT state, whereas erasing a p-type FET based memory cell may modify the state the memory cell is residing in from the HVT state to the LVT state. As an example, the programmed state may be an electrically conducting state (e.g. associated with a logic "1") and the erased state may be an electrically non-conducting state or at least less conducting than the programmed state (e.g., associated with a logic "0"). However, the definition of programmed state and erased state may be selected arbitrarily.

The term "switch" may be used herein to describe a modification of the memory state a memory cell is residing in. For example, in the case that a memory cell is residing in a first memory state (e.g., the LVT state), the memory state the memory cell is residing in may be switched such that, after the switch, the memory cell may reside in a second memory state (e.g., the HVT state), different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable layer. For example, a polarization of a remanent-polarizable layer may be switched, such that the sign of the polarization varies from positive to negative or from negative to positive, while the absolute value of the polarization may remain in some aspects substantially unaltered. According to various aspects, writing a memory cell may include bringing the memory cell from one of at least two memory states into another one of the at least two memory states of the memory cell (e.g., from the LVT state into the HVT state, or vice versa).

The term "shift" may be used herein to describe a change of a property of a memory cell or of a remanent-polarizable layer, such as a threshold voltage, a memory window, a coercive field, a polarization, a residual polarization, and the like. For example, a coercive field of a remanent-polarizable layer may be shifted, such that after the shift a value of the coercive field may be higher or lower than the value of the coercive field before the shift. Similarly, a threshold voltage of a memory cell may be shifted, such that after the shift a value of the threshold voltage may be higher or lower than the value of the threshold voltage before the shift.

The term "actual" may be used herein in relation to a condition or to one or more properties (e.g., of a memory cell) to include, for example, an instantaneous condition and/or an instantaneous property (e.g., an instantaneous value of a property). As an example, the term "actual" may be used to describe a condition and/or a property at a particular time point. An actual property and/or an actual value of a property may be different from a predefined property and/or from a predefined value of a property or it may be equal to the predefined property and/or to a predefined value of the property. Illustratively, this may be similar to an actual value and a reference value (e.g., set-point value) of a controlled variable in a system (e.g., in a feedback loop), wherein the actual value may be the value of the controlled variable at a given time point and the reference value may be a set (predefined) value the variable is supposed to have.

FIG. 2A may refer, for example, to a field-effect transistor (FET) based capacitive memory cell. Illustratively, the diagram in FIG. 2A illustrates $\text{Log}(I_D)$ plotted versus $+V_{GS}$ in the case that an n-type FET (n-FET) based capacitive memory cell is considered, and may illustrate $\text{Log}(I_D)$ plotted versus $-V_{GS}$ in the case that a p-type FET (p-FET) based capacitive memory cell is considered. Illustratively, if the memory cell 100 includes a p-type FET as the field-effect transistor structure 110 the characteristic may be mirrored with respect to the current axis (e.g., with respect to $V_{GS}=0$) as compared to the case where the memory cell 100 includes an n-type FET as the field-effect transistor structure 110.

According to various aspects, the drain current, $I_D$, may vary as a function of a gate-source voltage, $V_{GS}$, provided to the memory cell and/or as a function of the memory state (e.g., LVT memory state or HVT memory state) and/or the threshold voltage state (e.g., LVT state or HVT state) the memory cell is residing in. A current flow through the memory cell may reflect the memory state the memory cell is residing in, in the case that a gate-source voltage, $V_{GS}$, provided to the memory cell falls between the first threshold voltage, $V_{L-th}$, and the second threshold voltage, $V_{H-th}$. According to various aspects, the threshold voltages $V_{L-th}$, $V_{H-th}$ of the memory cell may define a memory window 220 associated with the memory cell. The memory window 220 may define a range of gate-source voltages, $V_{GS}$, (e.g., a range of gate voltages, $V_G$, in the case that the source voltage, Vs, is 0 V), which may be provided to the memory cell to determine its threshold voltage state and therefore its memory state.

As an example, a readout voltage, $V_R$, having a value falling between the first threshold voltage, $V_{L-th}$, and the second threshold voltage, $V_{H-th}$, (e.g., falling within the memory window 220) may be applied between the gate node and the source node of the memory cell. In the case that the memory cell is residing in the first memory state, for example the LVT state, a conductive state of the memory cell may be detected (e.g., a drain current above a reference current, $I_{Ref}$, for example a reference current of a sense amplifier used for detecting the drain current, $I_D$), for example associated with a logic "1". In the case that the memory cell is residing in the second memory state, for example the HVT state, a non-conductive state of the memory cell may be detected (e.g., a drain current below a reference current, $I_{Ref}$), for example associated with a logic "0".

FIG. 2A may show exemplarily the electrical characteristic of a FeFET based memory cell having a remanent-polarizable layer with remanent polarization characteristics. However, it is noted that another capacitive memory structure than a FeCAP structure or another memory cell than a FeFET based memory cell may show similar behaviors and effects as described herein with reference to the memory cell 100 (e.g., as described herein with reference to a FeFET based memory cell). The low threshold voltage, $V_{L-th}$, and the high threshold voltage, $V_{H-th}$, of the memory cell may have the respective initial values after writing the memory cell in the HVT memory state or LVT memory state. Illustratively, a first initial threshold voltage, $V_{L-th}$, may be associated with a first memory state (e.g., LVT state) and a second initial threshold voltage, $V_{H-th}$, may be associated with a second memory state (e.g., HVT state) of the memory cell. Accordingly, the memory window 220 of the memory cell may have its predefined width, and may be positioned at its predefined voltage range.

As shown in FIG. 2A, the memory cell may be configured to prevent a substantial current flow—if the memory cell is in the HVT state—when the readout voltage $V_R$ is applied, such that a drain current, $I_D$, below a reference current, $I_{Ref}$, may be detected during a readout. Accordingly, a non-conductive state of the memory cell may be determined in this case. The memory cell may be configured to allow a substantial current flow—if the memory cell is in the LVT state—when the readout voltage $V_R$ is applied, such that a drain current, $I_D$, above a reference current, $I_{Ref}$, may be detected during a readout. Accordingly, a conductive state of the memory cell may be determined in this case.

FIG. 2A shows the characteristics of a memory cell that may be desired to be caused by a writing operation. In some aspects, such characteristics of a memory cell can be realized by a writing process at a first time t0 (e.g., at the time of the writing operation that defines whether the memory cell is brought into the LVT state or into the HVT state); however, during a storage time, a change of the electronic properties of the memory cell may be observed. An actual value of the low threshold voltage, $V_{L-th}$, of the memory cell may shift, for example, to a lower or higher voltage with respect to its initial value as a function of time. An actual value of the high threshold voltage, $V_{H-th}$, may shift, for example, to a lower or higher voltage with respect to its initial value as a function of time. Accordingly, an actual position of the memory window may shift to a higher voltage range or to a lower voltage range with respect to its initial position as a function of time. The shifting may be caused, for example, by a charging effect of the floating node 100f of the memory cell 100, as explained in more detail below. In this view, a memory state of the memory cell may have various threshold voltage states associated therewith, e.g., an initial threshold voltage state (usually referred to as HVT and LVT states in the context of a field-effect transistor based memory cell), e.g., a shifted/modified/screened threshold voltage state (e.g., a screened LVT and a screened HVT state, as described herein).

In contrast to FIG. 2A that illustrates the characteristics of a memory cell 100 in the case that no substantial screening charge Qs is present at a floating node 100f of the memory cell 100 (e.g., at a first time t0, e.g., initially at the time of writing of the memory cell 100), FIG. 2B and FIG. 2C illustrate changes in the characteristics of the memory cell 100, e.g., at a second time t1, e.g., after a certain retention time. The change in the characteristics of the memory cell 100 may be, in some aspects, a function of a screening charge, Qs, present at the floating node 100f. The screening charge, Qs, may be negative (−Qs as illustrated in FIG. 2B) or positive (+Qs as illustrated in FIG. 2C). A negative screening charge (−Qs) at the floating gate may be caused by a current leakage during a retention time (t1-t0) in which the memory cell 100 is in the LVT state (see FIG. 2B). Illustratively, the electric field caused by the memory element 124 in the LVT state of the capacitive memory structure 120 of the memory cell 100 may support a discharge of an initially positively charged floating gate towards more negative values (e.g., towards zero volts). A positive screening charge (+Qs) at the floating gate may be caused by a current leakage during a retention time (t1-t0) in which the memory cell 100 is in the HVT state (see FIG. 2C). Illustratively, the electric field caused by the memory element 124 of the capacitive memory structure 120 in the HVT state of the memory cell 100 may support a discharge of an initially negatively charged floating gate towards more positive values (e.g., towards zero volts).

According to various aspects, it was found, see FIG. 2B and FIG. 2C, that a charging state of the floating node 100 of the memory cell 100, that is usually used to distinguish at least two memory cell states (e.g., LVT and HVT) from one another, may be screened by an introduction of an additional screening charge. Illustratively, a charged floating node may discharge over time which may cause problems in identifying an actual memory state in which the memory cell 100 resides in since a positively charged floating node caused by an initially written LVT state may discharge (e.g., to zero) and a negatively charged floating node caused by an initially written HVT state may discharge as well (e.g., to zero), which may cause the same or a too similar read response for both a memory cell in the LVT state and a memory cell in the HVT state, as explained in more detail below and with reference to FIG. 3A and FIG. 3B.

FIG. 2B illustrates a result of the changed floating gate potential due to the negative screening charge, −Qs. The memory cell 100 that may be initially written into an LVT state may have a shifted (e.g., negatively screened) low threshold voltage, $V_{L-th,sc-}$, and a shifted (e.g., negatively screened) high threshold voltage, $V_{H-th,sc-}$. Accordingly, the memory cell may have a shifted (e.g., negatively screened) memory window 220sc−. A shift in characteristic curves representing the LVT state and the HVT state may also be observed.

In the exemplary case illustrated in FIG. 2A and FIG. 2B, compared to the initial threshold voltage states, the actual values of the threshold voltages may be shifted to higher values (e.g., to greater values of the gate-source-voltage, $V_{GS}$). The negatively screened high threshold voltage, $V_{H-th,sc-}$, may be higher (e.g., it may have a greater absolute value) than the initial high threshold voltage, $V_{H-th}$. The negatively screened low threshold voltage, $V_{L-th,sc-}$, may be higher (e.g., it may have a greater absolute value) than the initial low threshold voltage, $V_{L-th}$. Accordingly, in this exemplary case, the initial memory window 220 may be shifted to higher voltage values (e.g., to more positive values of the gate-source-voltage, $V_{GS}$) resulting in the shifted (e.g., negatively screened) memory window 220sc−. The shift of the low threshold voltage may be represented by a first (e.g., low) threshold voltage shift, $\Delta V_{L-th}$, which may be or represent the difference between the negatively screened low threshold voltage, $V_{L-th,sc-}$, and the initial low threshold voltage, $V_{L-th}$ (see FIG. 2B). The shift of the high threshold voltage may be represented by a second (e.g., high) threshold voltage shift, $\Delta V_{H-th}$, which may be or represent the difference between the negatively screened high threshold voltage, $V_{H-th,sc-}$, and the initial high threshold voltage, $V_{H-th}$.

FIG. 2C illustrates a result of the changed floating gate potential due to the positive screening charge, +Qs. The memory cell 100 that may be initially written into an HVT state may have a shifted (e.g., positively screened) low threshold voltage, $V_{L-th,sc+}$, and a shifted (e.g., positively screened) high threshold voltage, $V_{H-th,sc+}$. Accordingly, the memory cell may have a shifted (e.g., positively screened) memory window 220sc+. A shift in characteristic curves representing the LVT state and the HVT state may also be observed.

In the exemplary case illustrated in FIG. 2A and FIG. 2C, compared to the initial threshold voltage states, the actual values of the threshold voltages may be shifted to lower values (e.g., to lower values of the gate-source-voltage, $V_{GS}$). The positively screened high threshold voltage, $V_{H-th,sc+}$, may be lower (e.g., it may have a lower absolute value) than the initial high threshold voltage, $V_{H-th}$. The positively screened low threshold voltage, $V_{L-th,sc+}$, may be lower (e.g., it may have a lower absolute value) than the initial low threshold voltage, $V_{L-th}$. Accordingly, in this exemplary case, the initial memory window 220 may be shifted to lower voltage values (e.g., to more negative values of the gate-source-voltage, $V_{GS}$) resulting in the shifted (e.g., positively screened) memory window 220sc+. The shift of the low threshold voltage may be represented by a first (e.g., low) threshold voltage shift, $\Delta V_{L-th}$, which may be or represent the difference between the positively screened low threshold voltage, $V_{L-th,sc+}$, and the initial low threshold voltage, $V_{L-th}$ (see FIG. 2C). The shift of the high threshold voltage may be represented by a second (e.g., high) threshold voltage shift, $\Delta V_{H-th}$, which may be or represent the difference between the positively screened high threshold voltage, $V_{H-th,sc+}$, and the initial high threshold voltage, $V_{H-th}$.

In general, a change of the memory properties of a memory cell (e.g., due to a charging of the floating gate of the memory cell due to leakage currents or other effects) may lead to issues in the case that the memory cell is read by means of a conventional reading scheme. The conventional reading scheme may lead to the result that a memory cell in the LVT state that is negatively screened (see FIG. 2B) has the same or a too similar current voltage characteristic during a conventional read out as a memory cell in the HVT state that is positively screened.

Figure 3A:
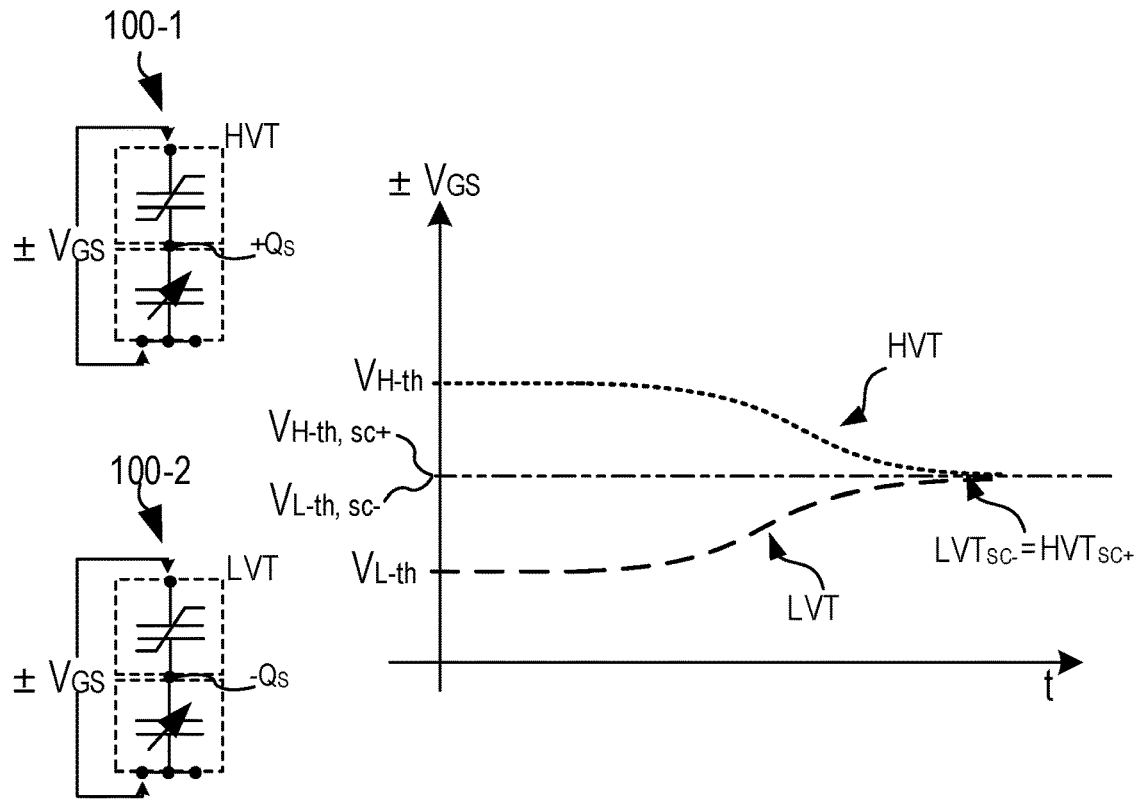
FIG. 3A and FIG. 3B show various aspects of electrical characteristics of a memory cell related to a conventional read out attempt of the memory cell in a schematic view.

FIG. 3A shows a comparison of voltage changes (see vertical axis of the diagram) of an initial high threshold voltage, $V_{H-th}$, of a first memory cell 100-1 being retained in a HVT state for a time, t, (see horizontal axis of the diagram) and an initial low threshold voltage, $V_{L-th}$, of a second memory cell 100-2 being retained in an LVT state for the time, t.

Since the first memory cell 100-1 is in a HVT state during a retention time, the charging of the floating gate with a positive screening charge, +Qs, may reduce the initial high threshold voltage, $V_{H-th}$, of the first memory cell 100-1 to a certain value (see positively screened high threshold voltage, $V_{H-th,sc+}$). Since the second memory cell 100-2 is in an LVT state during the retention time, the charging of the floating gate with a negative screening charge, −Qs, may increase the initial low threshold voltage, $V_{L-th}$, of the second memory cell 100-2 to the same value (see negatively screened low threshold voltage, $V_{L-th,sc-}$) as the first memory cell 100-1. As a result, two memory cells 100-1, 100-2 that are in distinct memory states may show the same current voltage characteristic during a read out since they have effectively the same threshold voltage and the memory cells are commonly read out based on their expected threshold voltage difference as explained with reference to FIG. 2A.

Figure 3B:
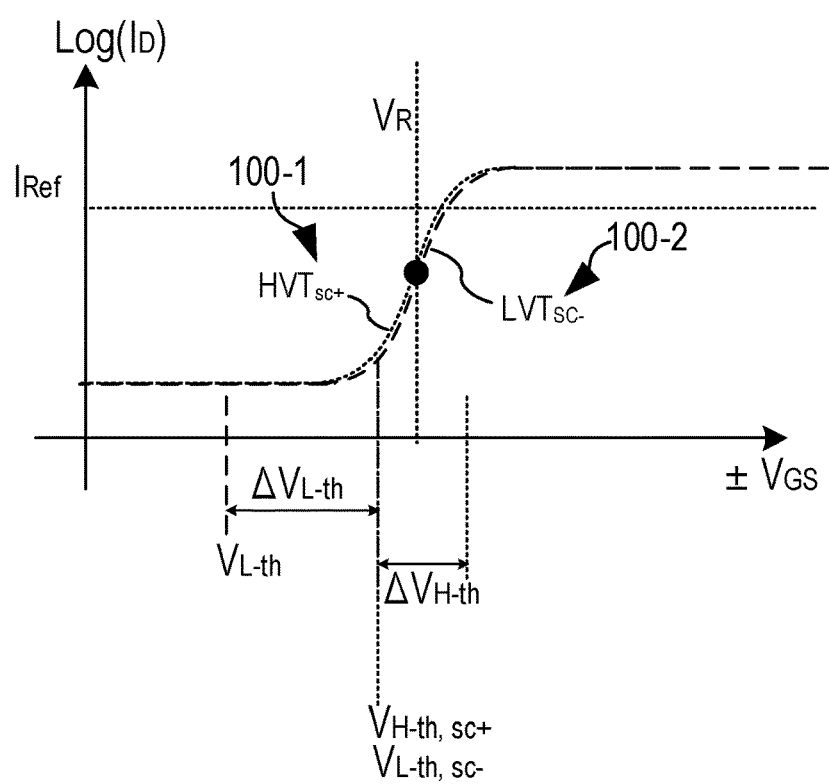

FIG. 3B shows a conventional reading approach that may fail to distinguish a first memory cell 100-1 in the HVT state that is positively screened (see FIG. 2C and FIG. 3A) from a second memory cell 100-2 in the LVT state that is negatively screened (see FIG. 2B and FIG. 3A). In some aspects, as an example, the change of the HVT, $\Delta V_{H-th}$, of the first memory cell 100-1 due to the positive screening may result in a positively screened high threshold voltage, $V_{H-th,sc+}$, that may be substantially equal or even lower than a negatively screened low threshold voltage, $V_{L-th,sc-}$, resulting from the change of the LVT, $\Delta V_{L-th}$, of the second memory cell 100-2 due to the positive screening. Therefore, a reading with the read voltage VR, despite selected within the initial memory window 220, may have the same reading current as result for both memory cells 100-1, 100-2 even though the memory cells 100-1, 100-2 are in distinct memory states LVT and HVT. In some aspects, the reading current of the first memory cell 100-1 in the HVT state may be even greater than the reading current of the second memory cell 100-2 in the LVT state, which is opposite to the expected behavior of the memory cells 100-1, 100-2.

As explained above, a conventional reading approach may not be successful to read out an actual memory state in which a memory may reside in correctly since the memory state may be stored and maintained correctly (a memory cell written in the LVT state may remain in the LVT state during the retention time and a memory cell written in the HVT state may remain in the HVT state during the retention time) but screened by a screening charge (−Qs, +Qs) transferred to the floating gate of the memory cell. This problem may be present more or less pronounced in any type of field-effect transistor based capacitive memory cell having a floating node between the capacitive memory structure of the memory cell and the field-effect transistor structure of the memory cell, see memory cell 100 described above or similar memory cells.

Therefore, according to various aspects, a read operation is suggested to read memory cells having such screened threshold voltage states $LVT_{SC-}$, $HVT_{SC+}$, as explained above (see, for example, FIG. 3A and FIG. 3B). The suggested read operation may be a destructive read operation. In other words, the memory state of the memory cell to be read out is written into a predefined memory state before the memory cell is read. This may include switching a memory cell that is not in the predefined memory state or maintaining a memory state of a memory cell that is already in the predefined memory state. Even though a memory state of a memory cell that is already in the predefined memory state may be not switched, this process may be regarded as a write (e.g., in terms of a rewrite) since a set of write voltages is applied to the memory cell independently of the actual memory state in which the memory cell is residing in since the memory state of the memory cell is unknown before the reading is accomplished.

As an example, if the predefined memory state is the HVT state, a memory cell that is in an LVT state may be switched into the HVT state during the destructive read operation and a memory cell that is in an HVT state may remain in the HVT state during the destructive read operation. Alternatively, if the predefined memory state is the LVT state, a memory cell that is in an LVT state may remain in the LVT state during the destructive read operation and a memory cell that is in an HVT state may be switched into the LVT state during the destructive read operation.

As can be seen in FIG. 2B and FIG. 2C, there is still a memory window 220sc−, 220sc+ present despite the threshold voltages are shifted and screened by the screening charge (−Qs, +Qs). Since it is known that during the suggested destructive read operation a memory cell is in a predefined memory state (e.g., either LVT or HVT), a memory cell is either in a positively screened LVT state ($LVT_{SC+}$) or a negatively screen LVT state ($LVT_{SC-}$) if the predefined memory state is the LVT state; or a memory cell is either in a positively screened HVT state ($HVT_{SC+}$) or a negatively screen HVT state ($HVT_{SC-}$) if the predefined memory state is the HVT state.

In the following, e.g., in FIGS. 4A to 4D, electrical characteristics of a memory cell 100 are described during a destructive read operation that allows for a distinction of screened threshold voltage states. Some aspects are described with reference to FIGS. 3A and 3B to show a difference in the reading result achieved by the proposed destructive read operation compared to a conventional reading as shown in FIG. 3B, according to various aspects.

FIG. 4A, FIG. 4B, FIG. 4C, and FIG. 4D show each a comparison of voltage changes (see vertical axis of the diagram) of an initial high threshold voltage, $V_{H-th}$, of a first memory cell 100-1 being retained in a HVT state for a time, t, (see horizontal axis of the diagram) and an initial low threshold voltage, $V_{L-th}$, of a second memory cell 100-2 being retained in an LVT state for the time, t, during a destructive read operation. At the time t1, the memory states of the two memory cells 100-1, 100-2 are screened threshold voltage states $LVT_{SC-}$, $HVT_{SC+}$, as described with reference to FIG. 3A and it may not be possible to distinguish the screened threshold voltage states $LVT_{SC-}$, $HVT_{SC+}$ from one another by a conventional read operation, as described with reference to FIG. 3B. However, the two memory cells 100-1, 100-2 having the screened threshold voltage states $LVT_{SC-}$, $HVT_{SC+}$ may be written into a predefined memory state during a destructive read operation at time t2 applied for each of the memory cells 100-1, 100-2. Illustratively, the respective memory element of the memory cells 100-1, 100-2 may be brought into the same memory state, e.g., into the HVT state or LVT state. If the memory element is remanently polarizable, both memory elements of the memory cells 100-1, 100-2 may be brought into the same polarization state (e.g., both memory elements have the same polarization direction after the writing) that defines the respective memory state (LVT, HVT). The writing may not substantially change the screening charge (−Qs, +Qs) present at the floating gate of the respective memory cell.

Figure 4A:
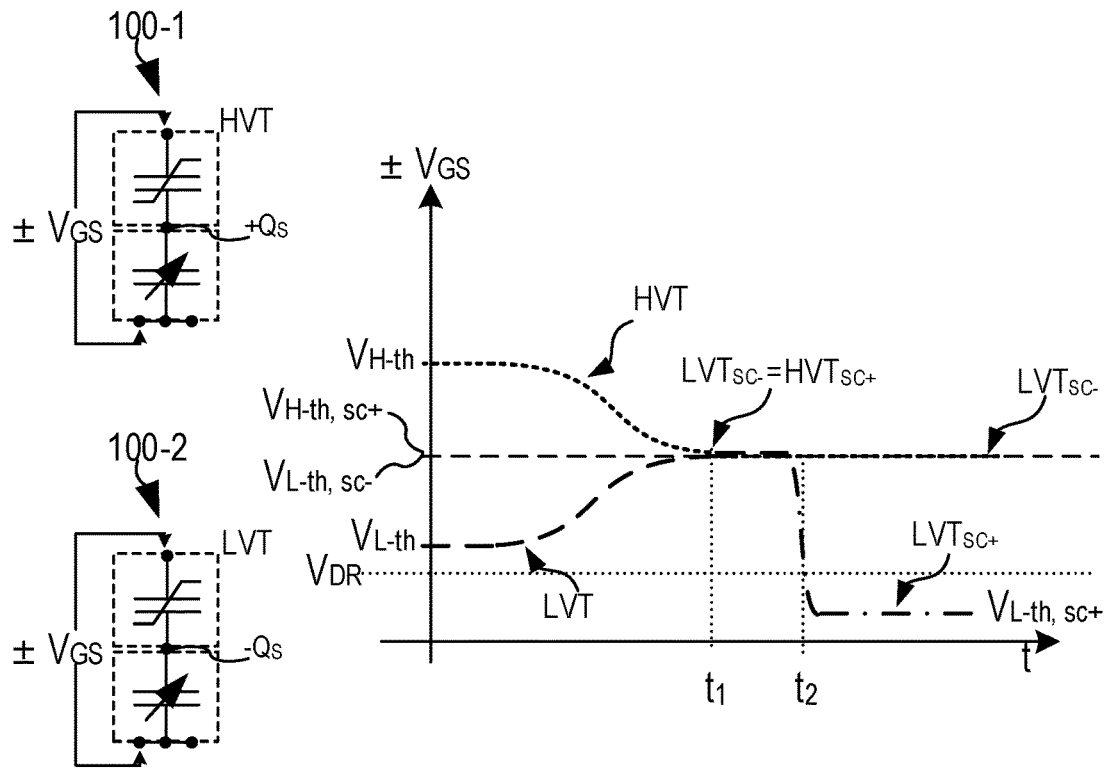
FIG. 4A to FIG. 4D show various aspects of electrical characteristics of a memory cell related to a destructive read operation to read the memory cell in a schematic view.
Figure 4B:
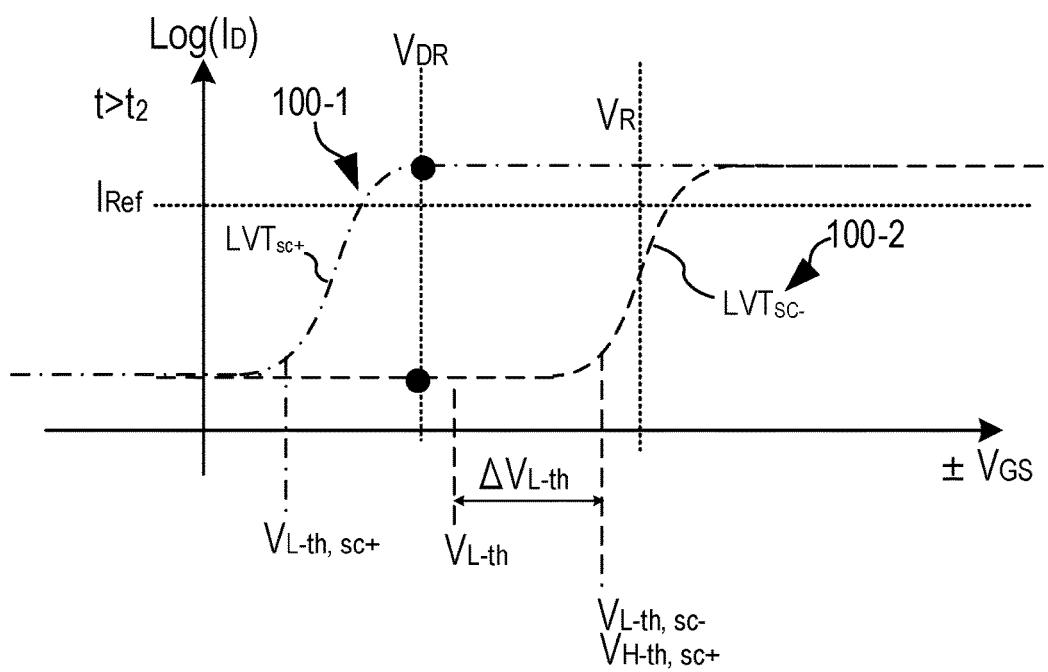

In one example, see FIG. 4A and FIG. 4B, the predefined memory state associated with the destructive read operation may be the LVT state. In this case, a memory cell (see memory cell 100-2) that was in the negatively screened LVT memory state ($LVT_{SC-}$) may remain substantially in the same negatively screened LVT memory state ($LVT_{SC-}$) during the writing phase of the destructive read operation. Therefore, during the destructive read operation, threshold voltage characteristics of a memory cell, that is prior to the destructive read operation already in the predefined memory state, may remain substantially the same or may change less compared to the other memory state. In comparison, a memory cell (see memory cell 100-1) that was in the positively screened HVT memory state ($HVT_{SC+}$) may be switched into the positively screened LVT memory state ($LVT_{SC+}$) during the writing phase of the destructive read operation. Therefore, during the destructive read operation, threshold voltage characteristics of a memory cell, that is prior to the destructive read operation not in the predefined memory state, may substantially change compared to the other memory state. Illustratively, the writing of a memory cell during the destructive read operation may assure that a memory cell, independently of its memory state prior to the destructive read operation, is in the pre-defined memory state. Under this assumption, the memory cell is, after the writing into the pre-defined memory state, either in a negatively screened LVT memory state ($LVT_{SC-}$) in the case that the memory cell was in the LVT state prior to the destructive read operation or in a positively screened LVT memory state ($LVT_{SC+}$) in the case that the memory cell was in the HVT state prior to the destructive read operation, see FIG. 4A. Therefore, a destructive read voltage $V_{DR}$ can be used (e.g., selected between $V_{L-th}$ and $V_{L-th,sc+}$) to distinguish whether a memory cell is, after the writing phase of the destructive read operation in the positively or negatively screened LVT memory state ($LVT_{SC+}$, $LVT_{SC-}$), and based on this determination, it can be concluded that the memory cell was, prior to the destructive read operation, either in the HVT state that corresponds to the written (switched during the destructive read operation) positively screened LVT memory state $LVT_{SC+}$ memory state or on the LVT state that corresponds to the remained negatively screened LVT memory state $LVT_{SC-}$.

As illustrated in FIG. 4B, a read out current caused by an applied destructive read out voltage $V_{DR}$ may be greater than a reference current, $I_{Ref}$, if a memory cell (e.g., memory cell 100-1) was in the HVT state prior to the destructive read operation and is switched during the destructive read operation into the LVT state (e.g., into the positively screened LVT memory state $LVT_{SC+}$) In the case that the destructive read out voltage $V_{DR}$ is selected lower than the initial low threshold voltage, $V_{L-th}$, it is unambiguous that the memory cell (e.g., memory cell 100-1) was in a positively screened HVT state ($HVT_{SC+}$) and therefore in an HVT memory state before the destructive read operation was carried out. This allows for a reading of memory cells 100-1, 100-2 even though they have screened threshold voltage states ($HVT_{SC+}$, $LVT_{SC-}$) which cannot be distinguished from one another by a conventional read operation, cf. FIG. 3B.

Since a positively screened LVT memory state ($LVT_{SC+}$) can be distinguished by a read operation from a negatively screened LVT memory state ($LVT_{SC-}$), the destructive read operation illustratively determines the type of screening charge present at the floating gate of the memory cell to be read out. If the memory cell is in an HVT state during a retention time, a positively screened LVT memory state ($LVT_{SC+}$) can be detected during the destructive read operation and if the memory cell is in an LVT state during a retention time, a negatively screened LVT memory state ($LVT_{SC-}$) can be detected during the destructive read operation.

Figure 4C:
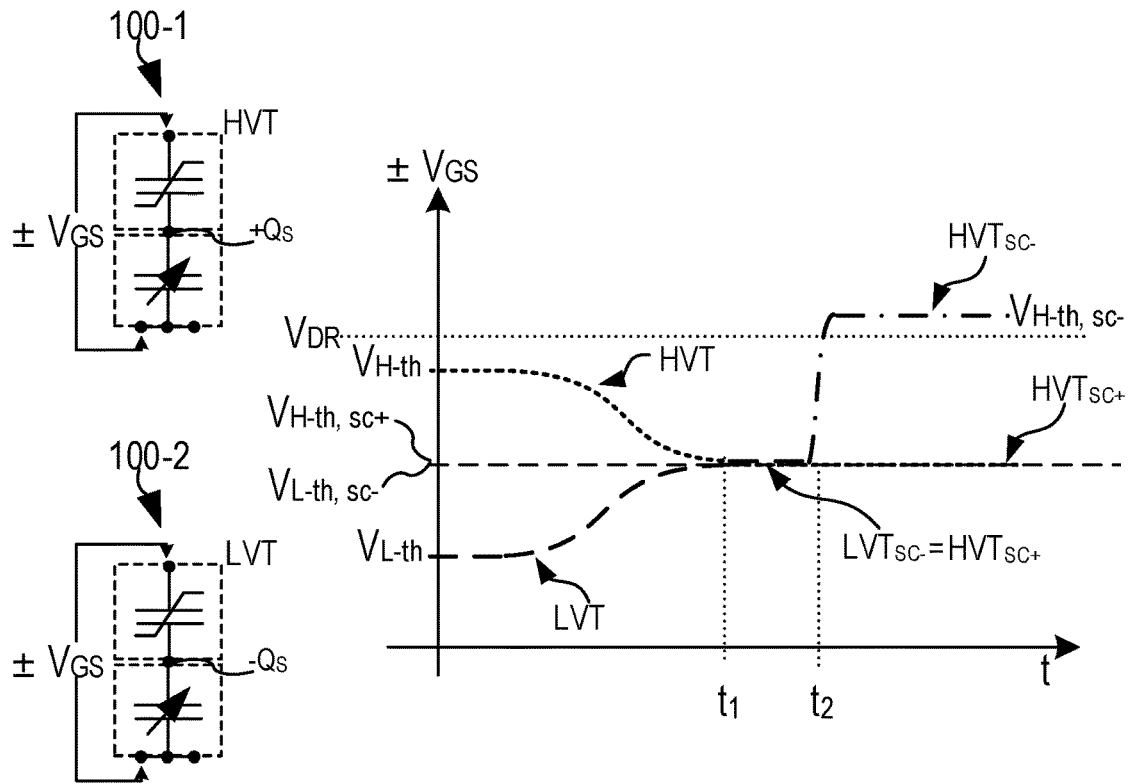
Figure 4D:
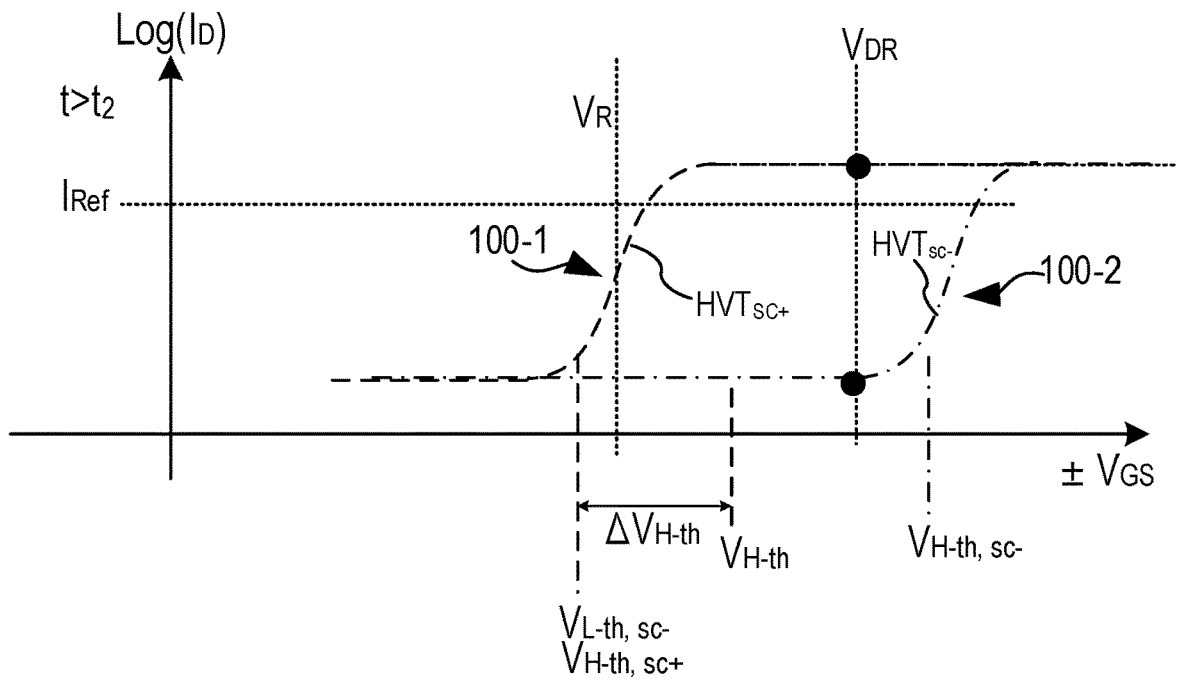

In another example, see FIG. 4C and FIG. 4D, the predefined memory state associated with the destructive read operation may be the HVT state. In this case, a memory cell (see memory cell 100-1) that was in the positively screened HVT memory state ($HVT_{SC+}$) may remain substantially in the same memory state ($HVT_{SC+}$) during the writing phase of the destructive read operation. Therefore, during the destructive read operation, threshold voltage characteristics of a memory cell, that is prior to the destructive read operation already in the predefined memory state, may remain substantially the same or may change less compared to the other memory state. In comparison, a memory cell (see memory cell 100-2) that was in the negatively screened LVT memory state ($LVT_{SC-}$) may be switched into the negatively screened HVT memory state ($HVT_{SC-}$) during the writing phase of the destructive read operation. Therefore, during the destructive read operation, threshold voltage characteristics of a memory cell, that is prior to the destructive read operation not in the predefined memory state, may substantially change compared to the other memory state. Illustratively, the writing of a memory cell during the destructive read operation may assure that a memory cell, independently of its memory state prior to the destructive read operation, is in the pre-defined memory state. Under this assumption, the memory cell is, after the writing into the pre-defined memory state, either in a positively screened HVT memory state ($HVT_{SC+}$) in the case that the memory cell was in the HVT state prior to the destructive read operation or in a negatively screened HVT memory state ($HVT_{SC-}$) in the case that the memory cell was in the LVT state prior to the destructive read operation, see FIG. 4C. Therefore, a destructive read voltage $V_{DR}$ can be used (e.g., selected between $V_{H-th}$ and $V_{H-th,sc-}$) to distinguish whether a memory cell is, after the writing phase of the destructive read operation in the positively or negatively screened HVT memory state ($HVT_{SC+}$, $HVT_{SC-}$), and based on this determination, it can be concluded that the memory cell was, prior to the destructive read operation, either in the HVT state corresponds to the remained positively screened HVT memory state $HVT_{SC+}$ memory state or on the LVT state that corresponds to the written (switched during the destructive read operation) negatively screened HVT memory state $HVT_{SC-}$.

As illustrated in FIG. 4D, a read out current caused by an applied destructive read out voltage $V_{DR}$ may be less than a reference current, $I_{Ref}$, if a memory cell (e.g., memory cell 100-2) was in the LVT state prior to the destructive read operation and is switched during the destructive read operation (e.g., into the negatively screened HVT memory state $HVT_{SC-}$). In the case that the destructive read out voltage $V_{DR}$ is selected higher than the initial high threshold voltage, $V_{H-th}$, it is unambiguous that the memory cell (e.g., memory cell 100-2) was in a negatively screened LVT state ($LVT_{SC-}$) and therefore in the LVT memory state before the destructive read operation was carried out. This allows for a reading of memory cells 100-1, 100-2 even though they have screened threshold voltage states ($HVT_{SC+}$, $LVT_{SC-}$) which cannot be distinguished from one another by a conventional read operation, cf. FIG. 3B.

Since a positively screened HVT memory state ($HVT_{SC+}$) can be distinguished by a read operation from a negatively screened HVT memory state ($HVT_{SC-}$), the destructive read operation illustratively determines the type of screening charge present at the floating gate of the memory cell to be read out. If the memory cell is in an HVT state during a retention time, a positively screened HVT memory state ($HVT_{SC+}$) can be detected during the destructive read operation and if the memory cell is in an LVT state during a retention time, a negatively screened HVT memory state ($HVT_{SC-}$) can be detected during the destructive read operation.

According to various aspects, the destructive read operation may include switching or remaining/maintaining a memory state of a memory cell in a predefined memory state, and detecting, whether the memory cell is conductive (e.g., causing a reading current greater than a reference current) at a destructive read voltage that is lower than an initial (e.g., intrinsic) low threshold voltage $V_{L-th}$ of the memory cell or whether the memory cell is non-conducive at a destructive read voltage that is greater than an initial (e.g., intrinsic) high threshold voltage $V_{H-th}$ of the memory cell. In both cases, it may be assumed that the memory cell was switched during the destructive read operation and was thus not in the predefined memory state. Therefore, the memory state of the memory cell prior to the destructive read operation can be determined.

Figure 5:
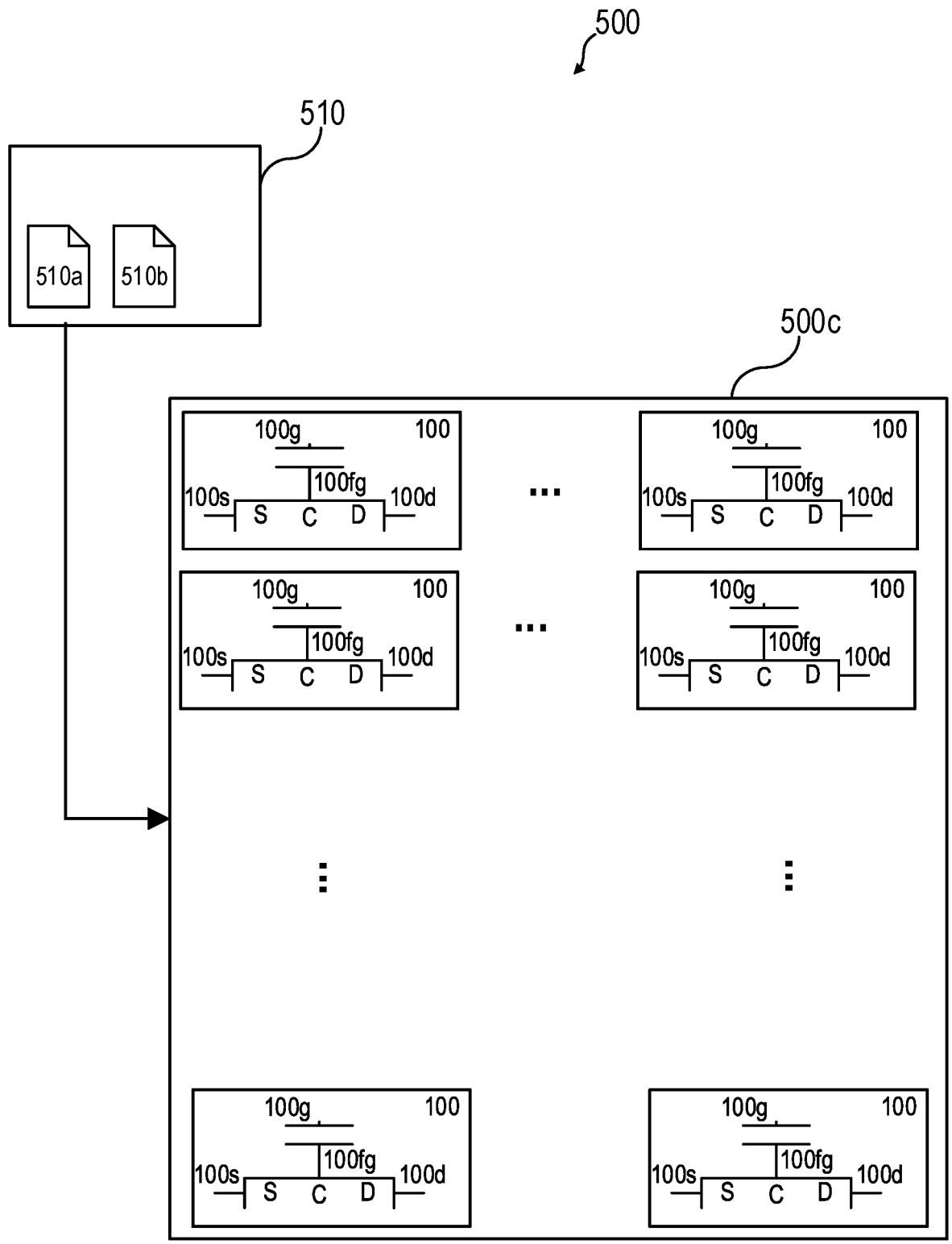
FIG. 5 shows various aspects of a memory controller included in a memory device or memory cell arrangement in a schematic view.

FIG. 5 shows a memory controller 510 of a memory device 500 or memory arrangement 500 in a schematic view, according to various aspects. The memory controller 510 may be configured, according to various aspects, to cause a destructive read operation of one or more field-effect transistor based capacitive memory cells 500c. Each of the one or more field-effect transistor based capacitive memory cells 500c may be configured as described herein, e.g., with reference to memory cell 100 and, accordingly, with reference to the first memory cell 100-1 and the second memory cell 100-2. According to various aspects, a field-effect transistor based capacitive memory cells may be either in a first memory state (e.g., an LVT memory state) or in a second memory state (e.g., in an HVT memory state). The memory state may be defined by the memory element of the capacitive memory structure of the memory cell. In the case that the memory element is a remanently polarizable memory element, a polarization state (e.g., a positive or negative remanent polarization) of the memory element may define the memory state of the memory cell. In the case that the memory element is based on remanent polarization, the field-effect transistor based capacitive memory cells may be referred to as ferroelectric memory cell, ferroelectric capacitor (FeCAP) based memory cell, and/or ferroelectric field-effect transistor (FeFET).

To determine, in which of the possible memory states the memory cell is residing in, the memory controller 510 may cause a destructive read operation, as described herein, for example, with reference to FIG. 4A to FIG. 4D. The memory controller 510 may be configured to determine, whether a memory cell to be read is switched during the destructive read operation or whether the memory cell to be read is not-switched (e.g., remains in its memory state) during the destructive read operation. If the memory cell 500c is switched during the destructive read operation, the memory cell may be in a switched memory state (e.g., in an LVT memory state switched from a previous HVT memory state or in a HVT memory state switched from a previous LVT memory state). The switched memory state can be unambiguously identified by a standard read operation. In some aspects, it may be indirectly detected whether or not the memory cell is switched during the destructive read operation by determining if the memory cell is not in a switched memory state in the case that only two possible memory states are available.

According to various aspects, the memory controller 510 may be configured to cause a standard (non-destructive) read operation to determine a memory state in which a memory cell resides in; and, only in the case that an error is detected during the standard (non-destructive) read operation (e.g., in the case that the memory state in which a memory cell resides in cannot be determined unambiguously by the standard (non-destructive) read operation) the memory controller 510 may cause the destructive read operation. According to various aspects, the memory controller 510 may be configured, in a first operation mode 510a, to cause a standard (non-destructive) read operation to determine a memory state in which a memory cell resides in; and, in a second operation mode 510b, to cause a destructive read operation to determine a memory state in which a memory cell resides in. The first operation mode may allow for a faster reading, e.g., in the case that no charge at the floating gate of the memory cell disturbs the standard (non-destructive) read operation (see FIG. 2A). The second operation mode may allow for a reading of screened threshold voltage states, e.g., in the case that a screening charge at the floating gate of the memory cell disturbs the standard (non-destructive) read operation (see FIG. 2B and FIG. 2C and FIG. 4A to FIG. 4D).

According to various aspects, the memory controller 510 may be configured to cause a destructive read operation to read a memory state in which a memory cell 100, e.g., a field-effect transistor based capacitive memory cell, is residing in prior to the destructive read operation. The destructive read operation may be used to determine whether the memory cell was initially written and/or retained (before the destructive read operation is carried out) in a first memory state or in a second memory state. The destructive read operation may include a write operation, e.g., applying a set of write voltages (e.g., a source voltage, a drain voltage, a bulk voltage, and/or a gate voltage) to the memory cell 100. The write operation associated with the destructive read operation may bring the memory cell 100 into a predefined memory state (e.g., into a first memory state associated with LVT states of the memory cell, e.g., into a second memory state associated with HVT states of the memory cell). The write operation associated with the destructive read operation may bring the capacitive memory structure 120 of the memory cell 100 into a predefined memory structure state (e.g., into a first memory element state associated with LVT states of the memory cell or into a second memory element state associated with HVT states of the memory cell). It is noted that the capacitive memory structure 120 of the memory cell 100 defines possible memory states (e.g., two distinct memory states referred to as LVT memory state and HVT memory state) in which the memory cell 100 may reside in. However, since a screening charge (+Qs, −Qs) may be present at a floating gate 100fg of the memory cell 100, the memory cell may have various threshold voltage states associated therewith, e.g., at least two initial threshold voltage states (e.g., an LVT state and a HVT state); e.g., at least two positively screened threshold voltage states (e.g., a positively screened LVT state $LVT_{sc+}$ and a positively screened HVT state $HVT_{sc+z}$); e.g., at least two negatively screened threshold voltage states (e.g., a negatively screened LVT state $LVT_{sc-}$ and a negatively screened HVT state $HVT_{sc-}$) Since a threshold based read operation may not show any sufficient difference in the current measurements of a positively screened HVT state $HVT_{sc+}$ and a negatively screened LVT state $LVT_{sc-}$, the memory cell 100 may be switched during the destructive read operation to bring either the positively screened HVT state $HVT_{sc+}$ into a positively screened LVT state $LVT_{sc+}$ or the negatively screened LVT state $LVT_{sc-}$ into a negatively screened HVT state $HVT_{sc-}$. These two threshold voltage states ($LVT_{sc+}$, $HVT_{sc-}$) may be characteristic and indicate a switching of the memory cell 100 during the destructive read operation. Via a comparison with the predefined memory state into which the memory cell 100 is written via the destructive read operation, the memory state of the memory cell 100 to be read can be determined. If the memory cell 100 switches during the destructive read operation, the memory cell 100 was not in the predefined memory state and if the memory cell 100 does not switch during the destructive read operation, the memory cell 100 was in the predefined memory state. If the memory cell 100 is in the positively screened LVT state LVT, after the write operation associated with the destructive read operation is carried out, the memory cell 100 was in the HVT memory state prior to the destructive read operation. If the memory cell 100 is in the negatively screened HVT state $HVT_{sc-}$ after the write operation associated with the destructive read operation is carried out, the memory cell 100 was in the LVT memory state prior to the destructive read operation.

In some aspects, the write operation may be implemented to bring the memory cell 100 from a first memory state into a second memory state (e.g., from an LVT memory state into a HVT memory state or vice versa). Therefore, if a screening charge is present at the floating gate of the memory cell 100, the threshold voltage state may be switched from a first threshold voltage state into a second threshold voltage state, e.g., a from a positively screened HVT state $HVT_{SC+}$ into a positively screened LVT state $LVT_{SC+}$ or from a negatively screened LVT state $LVT_{SC-}$ into a negatively screened HVT state $HVT_{SC-}$. The switched threshold voltage state may be indicative of the memory state in which the memory cell 100 was residing in prior to the destructive read operation, e.g., the positively screened LVT state $LVT_{SC+}$ may indicate that the memory cell 100 was residing in the HVT memory state prior to the destructive read operation, e.g., the negatively screened HVT state $HVT_{SC-}$ may indicate that the memory cell 100 was residing in the LVT memory state prior to the destructive read operation. The non-switched threshold voltage state may be indicative of the memory state in which the memory cell 100 was residing in prior to the destructive read operation, e.g., a positively screened HVT state $HVT_{SC+}$ is maintained during writing the memory cell 100 (e.g., into the HVT memory state as the predefined memory state) and may indicate that the memory cell 100 was residing in the HVT memory state prior to the HVT destructive read operation, e.g., a negatively screened LVT state $LVT_{SC-}$ is maintained during writing the memory cell 100 (e.g., into the LVT memory state as the predefined memory state) and may indicate that the memory cell 100 was residing in the LVT memory state prior to the LVT destructive read operation.

Accordingly, the memory controller 510 may be further configured to, after the write operation associated with the destructive read operation is carried out, cause a read operation to read the memory cell 100 and to determine, based on the read operation, whether the memory cell 100 was, prior to the destructive read operation (e.g., initially written), in the first memory sate or in the second memory state. Determining, based on the read operation, whether the memory cell 100 was, prior to the destructive read operation (e.g., initially written), in the first memory sate or in the second memory state may include to determine whether the memory cell is in a screened threshold voltage state associated with the first memory sate or in a screened threshold voltage associated with the second memory state.

According to various aspects, a memory device or cell arrangement 500 may include one or more field-effect transistor based capacitive memory cell 100, e.g., a field-effect transistor based capacitive memory cell 100 to be read. A field-effect transistor based capacitive memory cell 100 may include a memory element 124, wherein a memory state (e.g., a polarization state, e.g., a residual polarization state) of the memory element 124 may define whether the field-effect transistor based capacitive memory cell 100 is in a first memory state or in a second memory state (e.g., in an LVT memory state or in a HVT memory state). The memory device or cell arrangement 500 may further include a memory controller 510 configured to, in the case that a charging state (+Qs, −Qs) of the field-effect transistor based capacitive memory cell 100 screens an actual threshold voltage state (e.g., a positive charging state +Qs may screen a HVT state and a negative charging state −Qs may screen an LVT state) of the field-effect transistor based capacitive memory cell, cause a destructive read operation to determine whether the field-effect transistor based capacitive memory cell was, prior to the destructive read operation, residing in the first memory state or in the second memory state (e.g., in the LVT memory state or in the HVT memory state). Determine whether the field-effect transistor based capacitive memory cell was, prior to the destructive read operation, residing in the first memory state or in the second memory state may include determining a switching behavior of the memory cell during the destructive read operation.

According to various aspects, a memory cell arrangement may include at least a memory cell and a memory controller. The memory cell may include a field-effect transistor structure and a capacitive memory structure coupled to a floating gate of the field-effect transistor structure, the capacitive memory structure may include a spontaneously polarizable layer switchable into one of at least two polarization states. The memory controller may be configured to cause a destructive read operation to read the memory cell in the case that the floating gate is in a charged state. The destructive read operation may include: applying a set of write voltages to the memory cell to bring the capacitive memory structure into a pre-defined polarization state independently of a polarization state in which the capacitive memory structure was residing in prior to the application of the set of write voltages; and, subsequently, determining the memory state in which the memory cell was residing in prior to the application of the set of write voltages based on a source/drain current that flows through the field-effect transistor structure of the memory cell, the source/drain current representing a interaction of the pre-defined polarization state of the capacitive memory structure and the charge state of the floating gate of the field-effect transistor structure with one another.

Figure 6:
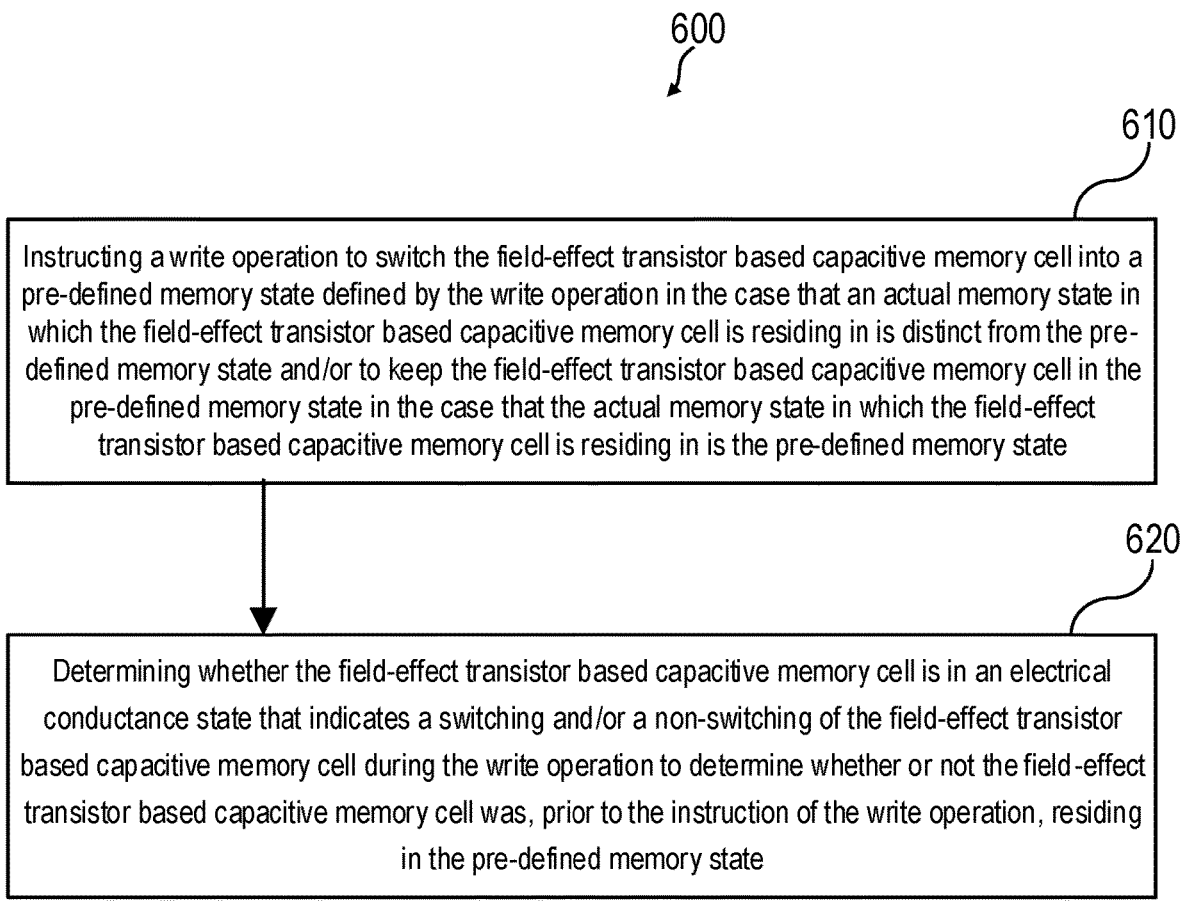
FIG. 6 shows a schematic flow diagram of a method of reading a memory cell, according to various aspects.

FIG. 6 shows a schematic flow diagram of a method 600 for reading a field-effect transistor based capacitive memory cell, according to various aspects. The method 600 for reading a field-effect transistor based capacitive memory cell may include: in 610, instructing a write operation to switch the field-effect transistor based capacitive memory cell into a pre-defined memory state defined by the write operation in the case that an actual memory state in which the field-effect transistor based capacitive memory cell is residing in is distinct from the pre-defined memory state and/or to keep the field-effect transistor based capacitive memory cell in the pre-defined memory state in the case that the actual memory state in which the field-effect transistor based capacitive memory cell is residing in is the pre-defined memory state; and, subsequently, in 620, determining whether the field-effect transistor based capacitive memory cell is in an electrical conductance state that indicates a switching and/or a non-switching of the field-effect transistor based capacitive memory cell during the write operation to determine whether or not the field-effect transistor based capacitive memory cell was, prior to the instruction of the write operation, residing in the pre-defined memory state.

FIG. 7 shows a schematic flow diagram of a method 700 for reading a field-effect transistor based capacitive memory cell, according to various aspects. The method 700 for reading a field-effect transistor based capacitive memory cell may include: in 710, instructing a write operation to switch the field-effect transistor based capacitive memory cell into a pre-defined memory state defined by the write operation in the case that an actual memory state in which the field-effect transistor based capacitive memory cell is residing in is distinct from the pre-defined memory state and/or to keep the field-effect transistor based capacitive memory cell in the pre-defined memory state in the case that the actual memory state in which the field-effect transistor based capacitive memory cell is residing in is the pre-defined memory state; and, subsequently, in 720, determining whether the field-effect transistor based capacitive memory cell is in an electrical conductance state that indicates that the field-effect transistor based capacitive memory cell was, prior to the instruction of the write operation, in the pre-defined memory state and/or determining whether the field-effect transistor based capacitive memory cell is in an electrical conductance state that indicates that the field-effect transistor based capacitive memory cell was, prior to the instruction of the write operation, not in the pre-defined memory state.

According to various aspects, the electrical conductance state that indicates that the field-effect transistor based capacitive memory cell was, prior to the instruction of the write operation, not in the pre-defined memory state may include the a switched screened threshold voltage state (e.g., a positively screened HVT state switched into a positively screened LVT state; e.g., a negatively screened LVT state switched into a negatively screened HVT state).

According to various aspects, the electrical conductance state that indicates that the field-effect transistor based capacitive memory cell was, prior to the instruction of the write operation, in the pre-defined memory state may include the a maintained screened threshold voltage state (e.g., a positively screened HVT state is maintained during the write operation in a positively screened HVT state; e.g., a negatively screened LVT state is maintained during the write operation in a negatively screened LVT state).

In the following, various examples are provided that refer to the memory cell 100, a memory controller 510, a memory device or the memory cell arrangement 500, and an operation of the memory cell 100, the memory controller, and the memory device or the memory cell arrangement 500.

Example 1 is a memory device, including: a memory controller configured to cause a destructive read operation to read a field-effect transistor based capacitive memory cell, the destructive read operation including: supplying a set of write voltages to the field-effect transistor based capacitive memory cell to switch the field-effect transistor based capacitive memory cell from a first memory state into a second memory state; and, subsequently, reading the field-effect transistor based capacitive memory cell and determining, based on the reading, whether the memory cell is in a first screened threshold voltage state or in a second screened threshold voltage state to determine whether the field-effect transistor based capacitive memory cell was, prior to the destructive read operation, initially written in the first memory state associated with the first screened threshold voltage state or initially written in the second memory state associated with the second screened threshold voltage state.

In Example 2, the memory device according to example 1 may optionally further include at least a field-effect transistor based capacitive memory cell, wherein the memory controller is configured to cause a destructive read operation to read the field-effect transistor based capacitive memory cell.

In Example 3, the memory device according to example 2 may optionally further include that the field-effect transistor based capacitive memory cell includes: a field-effect transistor structure and a capacitive memory structure coupled to the field-effect transistor structure, the capacitive memory structure including a memory element.

In Example 4, the memory device according to example 3 may optionally further include that the field-effect transistor based capacitive memory cell is configured such that the memory element defines the first memory state and the second memory state of the field-effect transistor based capacitive memory cell respectively.

In Example 5, the memory device according to any one of examples 2 to 4 may optionally further include that the field-effect transistor based capacitive memory cell is configured such that, after supplying the set of write voltages to the field-effect transistor based capacitive memory cell, a reversed first memory state and a non-reversed second memory state of the field-effect transistor based capacitive memory cell in interaction with a respective screening charge at a floating gate of the field-effect transistor based capacitive memory cell define the first screened threshold voltage state and the second screened threshold voltage state of the field-effect transistor based capacitive memory cell respectively.

In Example 6, the memory device according to example 3, 4, or 5 may optionally further include that the memory element includes a spontaneously polarizable layer such that the memory element is selectively switchable into a first polarization state and a second polarization state.

In Example 7, the memory device according to example 6 may optionally further include that the field-effect transistor based capacitive memory cell is configured such that the first polarization state and the second polarization state of the memory element define the first memory state and the second memory state of the field-effect transistor based capacitive memory cell respectively.

In Example 8, the memory device according to example 6 or 7 may optionally further include that the field-effect transistor based capacitive memory cell is configured such that the first polarization state of the spontaneously polarizable layer in interaction (in other words, in interplay, in combination) with a first screening charge at a floating gate define the first screened threshold voltage state; and/or that the field-effect transistor based capacitive memory cell is configured such that the second polarization state of the spontaneously polarizable layer in interaction with the first screening charge or with a second screening charge at a floating gate of the field-effect transistor based capacitive memory cell define the second screened threshold voltage state of the field-effect transistor based capacitive memory cell.

In Example 9, the memory device according to any one of examples 6 to 8 may optionally further include that the field-effect transistor based capacitive memory cell is configured such that a non-reversed first polarization state and a reversed second polarization state in interaction with a respective screening charge at a floating gate define the first screened threshold voltage state and the second screened threshold voltage state of the field-effect transistor based capacitive memory cell respectively; and/or that the field-effect transistor based capacitive memory cell is configured such that a reversed first polarization state and a non-reversed second polarization state in interaction with a respective screening charge at a floating gate define the first screened threshold voltage state and the second screened threshold voltage state of the field-effect transistor based capacitive memory cell respectively.

In Example 10, the memory device according to any one of examples 6 to 9 may optionally further include that the spontaneously polarizable layer is remanently polarizable; and/or that the spontaneously polarizable layer includes at least one remanent polarizable material.

In Example 11, the memory device according to any one of examples 6 to 10 may optionally further include that, in absence of a screening charge at a floating gate of the field-effect transistor based capacitive memory cell, a first threshold voltage state of the field-effect transistor structure corresponds to a first polarization state of the memory element and is associated with the first memory state of the field-effect transistor based capacitive memory cell, and that, in absence of a screening charge at the floating gate, a second threshold voltage state distinct from the first threshold voltage state of the field-effect transistor structure corresponds to a second polarization state of the memory element and is associated with the second memory state of the field-effect transistor based capacitive memory cell.

In Example 12, the memory device according to example 11 may optionally further include that a transition from the first threshold voltage state to the second threshold voltage state is associated with a change in a polarization of the spontaneously polarizable layer of the memory element.

In Example 13, the memory device according to any one of examples 6 to 12 may optionally further include that (if first memory state is switched during destructive read) the first screened threshold voltage state corresponds to an interaction of a reversed first polarization state of the memory element with a second screening charge at a floating gate of the field-effect transistor based capacitive memory cell, and that the second screened threshold voltage state corresponds to an interaction of a non-reversed second polarization state of the memory element with the second screening charge at the floating gate.

In Example 14, the memory device according to example 3 may optionally further include that the field-effect transistor structure includes a gate electrode layer, a dielectric layer, and a channel region, and that at least one of: the memory element is disposed between the gate electrode layer and the channel region of the field-effect transistor memory structure, and/or the memory element is in direct physical contact with both the gate electrode layer and the dielectric layer of the field-effect transistor memory structure, and/or the memory element is disposed between the gate electrode layer and the dielectric layer of the field-effect transistor memory structure.

Example 15 is a memory cell arrangement including: a field-effect transistor based capacitive memory cell including a memory element, wherein a memory state of the memory element defines a first memory state of the field-effect transistor based capacitive memory cell and wherein a second memory state of the memory element defines a second memory state of the field-effect transistor based capacitive memory cell; and a memory controller configured to, in the case that a charging state of the field-effect transistor based capacitive memory cell screens an actual threshold voltage state of the field-effect transistor based capacitive memory cell, cause a destructive read operation to determine whether the field-effect transistor based capacitive memory cell was, prior to the destructive read operation, residing in the first memory state or in the second memory state.

In Example 16, the memory cell arrangement according to example 15 may optionally further include that the destructive read operation includes: either switching the memory element from the second memory state into the first memory state in the case that the memory element is, prior to the destructive read operation, residing in the second memory state or maintaining the memory element in the first memory state in the case that the memory element is, prior to the destructive read operation, residing in the first memory state; and, subsequently, and determining whether the field-effect transistor based capacitive memory cell is in a (e.g., first) screened threshold voltage state that corresponds to a switching of the memory element during the destructive read operation from the second memory state into the first memory state and/or whether the field-effect transistor based capacitive memory cell is in a (e.g., second) screened threshold voltage state that corresponds to a non-switching of the memory element during the destructive read operation.

In Example 17, the memory cell arrangement according to example 15 may optionally further include that the destructive read operation includes: either switching the memory element from the first memory state into the second memory state in the case that the memory element is, prior to the destructive read operation, residing in the first memory state or maintaining the memory element in the second memory state in the case that the memory element is, prior to the destructive read operation, residing in the second memory state; and, subsequently, determining whether the field-effect transistor based capacitive memory cell is in a (e.g., first) screened threshold voltage state that corresponds to a switching of the memory element during the destructive read operation from the first memory state into the second memory state and/or whether the field-effect transistor based capacitive memory cell is in a (e.g., second) screened threshold voltage state that corresponds to a non-switching of the memory element during the destructive read operation.

In Example 18, the memory cell arrangement according to any one of examples 15 to 17 may optionally further include that the field-effect transistor based capacitive memory cell includes: a field-effect transistor structure and a capacitive memory structure coupled to the field-effect transistor structure, the capacitive memory structure including the memory element, the field-effect transistor structure and the capacitive memory structure including a floating gate.

In Example 19, the memory cell arrangement according to example 18 may optionally further include that the memory element includes a spontaneously polarizable layer such that the memory element is selectively switchable into a first polarization state and a second polarization state.

In Example 20, the memory cell arrangement according to example 19 may optionally further include that the field-effect transistor based capacitive memory cell is configured such that the first polarization state and the second polarization state of the memory element define the first memory state and the second memory state of the field-effect transistor based capacitive memory cell respectively.

In Example 21, the memory cell arrangement according to example 19 or 20 may optionally further include that the spontaneously polarizable layer is remanently polarizable, and/or that the spontaneously polarizable layer includes at least one remanent polarizable material.

In Example 22, the memory cell arrangement according to any one of examples 19 to 21 may optionally further include that, in absence of a screening charge at the floating gate, a first threshold voltage state of the field-effect transistor structure corresponds to the first polarization state of the memory element and is associated with the first memory state of the field-effect transistor based capacitive memory cell, and that, in absence of a screening charge at the floating gate, a second threshold voltage state distinct from the first threshold voltage state of the field-effect transistor structure corresponds to a second polarization state of the memory element and is associated with the second memory state of the field-effect transistor based capacitive memory cell.

In Example 23, the memory cell arrangement according to example 22 may optionally further include that a transition from the first threshold voltage state to the second threshold voltage state is associated with a change in a polarization of the spontaneously polarizable layer of the memory element.

In Example 24, the memory cell arrangement according to any one of examples 19 to 23 may optionally further include that, in presence of a screening charge at the floating gate, a screened threshold voltage state of the field-effect transistor structure corresponds to the first polarization state of the memory element and is associated with the first memory state of the field-effect transistor based capacitive memory cell, and that, in absence of a screening charge at the floating gate, a threshold voltage state distinct from the screened threshold voltage state of the field-effect transistor structure corresponds to the first polarization state of the memory element and is associated with the first memory state of the field-effect transistor based capacitive memory cell.

In Example 25, the memory cell arrangement according to any one of examples 19 to 24 may optionally further include that, in presence of a screening charge at the floating gate, a screened threshold voltage state of the field-effect transistor structure corresponds to the second polarization state of the memory element and is associated with the second memory state of the field-effect transistor based capacitive memory cell, and that, in absence of a screening charge at the floating gate, a threshold voltage state distinct from the screened threshold voltage state of the field-effect transistor structure corresponds to the second polarization state of the memory element and is associated with the second memory state of the field-effect transistor based capacitive memory cell.

In Example 26, the memory cell arrangement according to any one of examples 19 to 25 may optionally further include that the field-effect transistor based capacitive memory cell is configured such that the first polarization state of the spontaneously polarizable layer in interaction with a first screening charge at the floating gate define a first screened threshold voltage state and the second polarization state of the spontaneously polarizable layer in interaction with a second screening charge at the floating gate define a second screened threshold voltage state of the field-effect transistor based capacitive memory cell.

In Example 27, the memory cell arrangement according to any one of examples 19 to 26 may optionally further include that a screened threshold voltage state that corresponds to a switching of the field-effect transistor based capacitive memory cell during the destructive read operation corresponds to an interaction of a reversed first memory state of a memory element of the field-effect transistor based capacitive memory cell with a screening charge at a floating gate of the field-effect transistor based capacitive memory cell or to an interaction of a reversed second memory state of a memory element of the field-effect transistor based capacitive memory cell with a screening charge at a floating gate of the field-effect transistor based capacitive memory cell; and that a screened threshold voltage state that corresponds to a non-switching of the field-effect transistor based capacitive memory cell during the destructive read operation corresponds to an interaction of a non-reversed first memory state of the memory element with a screening charge at the floating gate or to an interaction of a non-reversed second memory state of the field-effect transistor based capacitive memory cell with a screening charge at the floating gate.

In Example 28, the memory cell arrangement according to example 18 may optionally further include that the field-effect transistor structure includes a gate electrode layer, a dielectric layer, and a channel region, and that at least one of: the memory element is disposed between the gate electrode layer and the channel region of the field-effect transistor memory structure, and/or the memory element is in direct physical contact with both the gate electrode layer and the dielectric layer of the field-effect transistor memory structure, and/or the memory element is disposed between the gate electrode layer and the dielectric layer of the field-effect transistor memory structure.

Example 29 is a memory cell arrangement including: a memory cell including field-effect transistor structure and a capacitive memory structure coupled to a floating gate of the field-effect transistor structure, the capacitive memory structure including a spontaneously polarizable layer switchable into one of at least two polarization states; and a memory controller configured to cause a destructive read operation to read the memory cell in the case that a screening charge is present at the floating gate, the destructive read operation including: applying a set of write voltages to the memory cell to bring the capacitive memory structure of the memory cell into a pre-defined polarization state independently of a polarization state in which the capacitive memory structure was residing in prior to the application of the set of write voltages; and, subsequently, determining the memory state in which the memory cell was residing in prior to the application of the set of write voltages based on a source/drain current that flows through the field-effect transistor structure of the memory cell, the source/drain current representing a interaction of the pre-defined polarization state of the capacitive memory structure and the screening charge is present at the floating gate of the field-effect transistor structure with one another.

In Example 30, the memory cell arrangement according to example 29 may optionally further include one or more features of examples 15 to 28.

Example 31 is a method for reading a field-effect transistor based capacitive memory cell, the method including: instructing a write operation to either switch the field-effect transistor based capacitive memory cell into a pre-defined memory state defined by the write operation in the case that an actual memory state in which the field-effect transistor based capacitive memory cell is residing in is distinct from the pre-defined memory state, or keep the field-effect transistor based capacitive memory cell in the pre-defined memory state in the case that the actual memory state in which the field-effect transistor based capacitive memory cell is residing in is the pre-defined memory state; and, subsequently, determining whether the field-effect transistor based capacitive memory cell is in an electrical conductance state that indicates a switching and/or a non-switching of the field-effect transistor based capacitive memory cell during the write operation to determine whether or not the field-effect transistor based capacitive memory cell was, prior to the instruction of the write operation, residing in the pre-defined memory state.

In Example 32, the method according to example 31 may optionally further include that the electrical conductance state is indicative of a charging of a floating gate of the field-effect transistor based capacitive memory cell during a retention time prior to the reading of the field-effect transistor based capacitive memory cell.

In Example 33, the method according to example 31 or 32 may optionally further include that the electrical conductance state is a screened threshold voltage state.

In Example 34, the method according to example 31 may optionally further include that the charging of the floating gate of the field-effect transistor based capacitive memory cell is a function of a memory state in which the field-effect transistor based capacitive memory cell is residing in during the retention time prior to the reading of the field-effect transistor based capacitive memory cell.

In Example 35, the method according to any one of examples 31 to 34 may optionally further include, prior to the instruction of the write operation, instructing a read operation to read the field-effect transistor based capacitive memory cell by applying a read voltage at the field-effect transistor based capacitive memory cell and determining a source/drain current flow through the field-effect transistor based capacitive memory cell; and instructing the write operation only in the case that one or more errors occur during the read operation.

In Example 36, the method according to any one of examples 31 to 34 may optionally further include, prior to the instruction of the write operation, checking whether or not a floating gate of the field-effect transistor based capacitive memory cell is charged to an electrical screening voltage that screens the actual memory state in which the field-effect transistor based capacitive memory cell is residing in; and in the case that the floating gate of the field-effect transistor based capacitive memory cell is not charged to an electrical screening voltage, instructing a read operation to read the field-effect transistor based capacitive memory cell by applying a read voltage at the field-effect transistor based capacitive memory cell and determining a source/drain current flow through the field-effect transistor based capacitive memory cell in the case that, or in the case that the floating gate of the field-effect transistor based capacitive memory cell is charged to an electrical screening voltage, instructing the write operation and the subsequent determination of the electrical conductance state of the field-effect transistor based capacitive memory cell.

In Example 37, the method according to example 35 or 36 may optionally further include that determining whether the field-effect transistor based capacitive memory cell is in an electrical conductance state that indicates a switching and/or a non-switching of the field-effect transistor based capacitive memory cell during the write operation prior to the instruction of the write operation includes: applying a destructive read voltage at the field-effect transistor based capacitive memory cell and determine a corresponding source/drain current flow through the field-effect transistor based capacitive memory cell, wherein the destructive read voltage is greater or less than the read voltage associated with the read operation prior to the instruction of the write operation.

Example 38 is a memory device, including: a memory controller configured to cause a destructive read operation to read a field-effect transistor based capacitive memory cell, the destructive read operation including: supplying a set of write voltages to the field-effect transistor based capacitive memory cell to switch the field-effect transistor based capacitive memory cell from a second memory state into a first memory state; and, subsequently, reading the field-effect transistor based capacitive memory cell and determining, based on the reading, whether the memory cell is in a first screened threshold voltage state or in a second screened threshold voltage state to determine whether the field-effect transistor based capacitive memory cell was, prior to the destructive read operation, initially written in the first memory state associated with the first screened threshold voltage state or initially written in the second memory state associated with the second screened threshold voltage state, wherein the field-effect transistor based capacitive memory cell is configured such that, after supplying the set of write voltages to the field-effect transistor based capacitive memory cell, a non-reversed (e.g., a non-switched, unchanged polarization state) first memory state and a reversed second memory state of the field-effect transistor based capacitive memory cell in interaction with a respective screening charge at a floating gate of the field-effect transistor based capacitive memory cell define the first screened threshold voltage state and the second screened threshold voltage state of the field-effect transistor based capacitive memory cell respectively.

In Example 39, the memory device according to example 38 may optionally further include that (if second memory state is switched during destructive read) the first screened threshold voltage state corresponds to an interaction of a non-reversed first polarization state of the memory element with a first screening charge at a floating gate of the field-effect transistor based capacitive memory cell, and that the second screened threshold voltage state corresponds to an interaction of a reversed second polarization state of the memory element with the first screening charge at the floating gate.

In Example 40, the memory device according to example 38 or 39 may optionally further include one or more features of examples 1 to 14.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a layer "over" a side or surface, may be used to mean that the feature, e.g., the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "spontaneously polarizable material" or "spontaneous-polarizable material" may be used herein with reference to a material or layer that has a polarization capability in addition to its dielectric polarization capability. A spontaneously-polarizable material may be or may include a spontaneously-polarizable material that shows a remanence, e.g., a ferroelectric material, and/or a spontaneously-polarizable material that shows no remanence, e.g., an anti-ferroelectric material.

Several aspects are described with reference to a structure (e.g., a field-effect transistor structure, e.g., a ferroelectric field-effect transistor structure, e.g., a capacitive memory structure) and it is noted that such a structure may include solely the respective element (e.g., a field-effect transistor, e.g., a ferroelectric field-effect transistor, e.g., a capacitive memory); or, in other aspects, a structure may include the respective element and one or more additional elements.

According to various aspects, a capacitive memory structure may include a ferroelectric capacitor (FeCAP) or an anti-ferroelectric capacitor (AFeCAP); or, in other aspects, a capacitive memory structure may include a ferroelectric capacitor or an anti-ferroelectric capacitor (AFeCAP), and one or more additional elements. According to various aspects, a capacitive memory structure may include a capacitive memory element, e.g., a ferroelectric layer, e.g., an anti-ferroelectric layer. According to various aspects, a field-effect transistor based capacitive memory structure may include a field-effect transistor structure and a capacitive memory structure coupled to or integrated in the field-effect transistor structure; or, in other aspects, a field-effect transistor based capacitive memory structure may include a field-effect transistor structure, capacitive memory structure, and one or more additional elements. According to various aspects, a field-effect transistor based capacitive memory structure may include a field-effect transistor structure and a capacitive memory element integrated in the field-effect transistor structure.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory device, comprising:
a memory controller configured to cause a destructive read operation to read a field-effect transistor based capacitive memory cell, the destructive read operation comprising:
supplying a set of write voltages to the field-effect transistor based capacitive memory cell to switch the field-effect transistor based capacitive memory cell from a first memory state into a second memory state; and, subsequently,
reading the field-effect transistor based capacitive memory cell and determining, based on the reading, whether the memory cell is in a first screened threshold voltage state or in a second screened threshold voltage state to determine whether the field-effect transistor based capacitive memory cell was, prior to the destructive read operation, initially written in the first memory state associated with the first screened threshold voltage state or initially written in the second memory state associated with the second screened threshold voltage state.

2. The memory device according to claim 1, further comprising:
at least a field-effect transistor based capacitive memory cell, wherein the memory controller is configured to cause a destructive read operation to read the field-effect transistor based capacitive memory cell.

3. The memory device according to claim 2,
wherein the field-effect transistor based capacitive memory cell comprises:
a field-effect transistor structure and a capacitive memory structure coupled to the field-effect transistor structure, the capacitive memory structure comprising a memory element.

4. The memory device according to claim 3,
wherein the field-effect transistor based capacitive memory cell is configured such that the memory element defines the first memory state and the second memory state of the field-effect transistor based capacitive memory cell respectively.

5. The memory device according to claim 2,
wherein the field-effect transistor based capacitive memory cell is configured such that, after supplying the set of write voltages to the field-effect transistor based capacitive memory cell, a reversed first memory state and a non-reversed second memory state of the field-effect transistor based capacitive memory cell in interaction with a respective screening charge at a floating gate of the field-effect transistor based capacitive memory cell define the first screened threshold voltage state and the second screened threshold voltage state of the field-effect transistor based capacitive memory cell respectively.

6. The memory device according to claim 3,
wherein the memory element comprises a spontaneously polarizable layer such that the memory element is selectively switchable into a first polarization state and a second polarization state.

7. The memory device according to claim 6,
wherein the field-effect transistor based capacitive memory cell is configured such that the first polarization state and the second polarization state of the memory element define the first memory state and the second memory state of the field-effect transistor based capacitive memory cell respectively.

8. The memory device according to claim 6,
wherein the field-effect transistor based capacitive memory cell is configured such that the first polarization state of the spontaneously polarizable layer in interaction with a first screening charge at a floating gate define the first screened threshold voltage state; and/or
wherein the field-effect transistor based capacitive memory cell is configured such that the second polarization state of the spontaneously polarizable layer in interaction with the first screening charge or with a second screening charge at a floating gate of the field-effect transistor based capacitive memory cell define the second screened threshold voltage state of the field-effect transistor based capacitive memory cell.

9. The memory device according to claim 6,
wherein the field-effect transistor based capacitive memory cell is configured such that a non-reversed first polarization state and a reversed second polarization state in interaction with a respective screening charge at a floating gate define the first screened threshold voltage state and the second screened threshold voltage state of the field-effect transistor based capacitive memory cell respectively; and/or
wherein the field-effect transistor based capacitive memory cell is configured such that a reversed first polarization state and a non-reversed second polarization state in interaction with a respective screening charge at a floating gate define the first screened threshold voltage state and the second screened threshold voltage state of the field-effect transistor based capacitive memory cell respectively.

10. A memory cell arrangement comprising:
a field-effect transistor based capacitive memory cell comprising a memory element, wherein a memory state of the memory element defines a first memory state of the field-effect transistor based capacitive memory cell and wherein a second memory state of the memory element defines a second memory state of the field-effect transistor based capacitive memory cell; and
a memory controller configured to, in the case that a charging state of the field-effect transistor based capacitive memory cell screens an actual threshold voltage state of the field-effect transistor based capacitive memory cell, cause a destructive read operation to determine whether the field-effect transistor based capacitive memory cell was, prior to the destructive read operation, residing in the first memory state or in the second memory state.

11. The memory cell arrangement of claim 10,
wherein the destructive read operation comprises:
  either switching the memory element from the second memory state into the first memory state in the case that the memory element is, prior to the destructive read operation, residing in the second memory state or maintaining the memory element in the first memory state in the case that the memory element is, prior to the destructive read operation, residing in the first memory state; and, subsequently, and
  determining whether the field-effect transistor based capacitive memory cell is in a screened threshold voltage state that corresponds to a switching of the memory element during the destructive read operation from the second memory state into the first memory state and/or whether the field-effect transistor based capacitive memory cell is in a screened threshold voltage state that corresponds to a non-switching of the memory element during the destructive read operation.

12. The memory cell arrangement of claim 10,
wherein the destructive read operation comprises:
  either switching the memory element from the first memory state into the second memory state in the case that the memory element is, prior to the destructive read operation, residing in the first memory state or maintaining the memory element in the second memory state in the case that the memory element is, prior to the destructive read operation, residing in the second memory state; and, subsequently,
  determining whether the field-effect transistor based capacitive memory cell is in a screened threshold voltage state that corresponds to a switching of the memory element during the destructive read operation from the first memory state into the second memory state and/or whether the field-effect transistor based capacitive memory cell is in a screened threshold voltage state that corresponds to a non-switching of the memory element during the destructive read operation.

13. The memory cell arrangement according to claim 10,
wherein the field-effect transistor based capacitive memory cell comprises: a field-effect transistor structure and a capacitive memory structure coupled to the field-effect transistor structure, the capacitive memory structure comprising the memory element, the field-effect transistor structure and the capacitive memory structure comprising a floating gate.

14. The memory cell arrangement according to claim 13,
wherein the memory element comprises a spontaneously polarizable layer such that the memory element is selectively switchable into a first polarization state and a second polarization state.

15. The memory cell arrangement according to claim 14,
wherein the field-effect transistor based capacitive memory cell is configured such that the first polarization state and the second polarization state of the memory element define the first memory state and the second memory state of the field-effect transistor based capacitive memory cell respectively.

16. The memory cell arrangement according to claim 14,
wherein, in absence of a screening charge at the floating gate, a first threshold voltage state of the field-effect transistor structure corresponds to the first polarization state of the memory element and is associated with the first memory state of the field-effect transistor based capacitive memory cell, and
wherein, in absence of a screening charge at the floating gate, a second threshold voltage state distinct from the first threshold voltage state of the field-effect transistor structure corresponds to a second polarization state of the memory element and is associated with the second memory state of the field-effect transistor based capacitive memory cell.

17. The memory cell arrangement according to claim 14,
wherein, in presence of a screening charge at the floating gate, a screened threshold voltage state of the field-effect transistor structure corresponds to the first polarization state of the memory element and is associated with the first memory state of the field-effect transistor based capacitive memory cell, and
wherein, in absence of a screening charge at the floating gate, a threshold voltage state distinct from the screened threshold voltage state of the field-effect transistor structure corresponds to the first polarization state of the memory element and is associated with the first memory state of the field-effect transistor based capacitive memory cell.

18. The memory cell arrangement according to claim 10,
wherein a screened threshold voltage state that corresponds to a switching of the field-effect transistor based capacitive memory cell during the destructive read operation corresponds to an interaction of a reversed first memory state of a memory element of the field-effect transistor based capacitive memory cell with a screening charge at a floating gate of the field-effect transistor based capacitive memory cell or to an interaction of a reversed second memory state of a memory element of the field-effect transistor based capacitive memory cell with a screening charge at a floating gate of the field-effect transistor based capacitive memory cell; and
wherein a screened threshold voltage state that corresponds to a non-switching of the field-effect transistor based capacitive memory cell during the destructive read operation corresponds to an interaction of a non-reversed first memory state of the memory element with a screening charge at the floating gate or to an interaction of a non-reversed second memory state of the field-effect transistor based capacitive memory cell with a screening charge at the floating gate.

19. A method for reading a field-effect transistor based capacitive memory cell, the method comprising:
  instructing a write operation to
    either switch the field-effect transistor based capacitive memory cell into a pre-defined memory state defined by the write operation in the case that an actual memory state in which the field-effect transistor based capacitive memory cell is residing in is distinct from the pre-defined memory state, or
    keep the field-effect transistor based capacitive memory cell in the pre-defined memory state in the case that the actual memory state in which the field-effect transistor based capacitive memory cell is residing in is the pre-defined memory state; and, subsequently,
  determining whether the field-effect transistor based capacitive memory cell is in an electrical conductance state that indicates a switching and/or a non-switching of the field-effect transistor based capacitive memory cell during the write operation to determine whether or not the field-effect transistor based capacitive memory cell was, prior to the instruction of the write operation, residing in the pre-defined memory state.

20. The method of claim 19, wherein the electrical conductance state is indicative of a charging of a floating gate of the field-effect transistor based capacitive memory cell during a retention time prior to the reading of the field-effect transistor based capacitive memory cell.

* * * * *